US007964932B2

(12) United States Patent
Silver et al.

(10) Patent No.: US 7,964,932 B2
(45) Date of Patent: Jun. 21, 2011

(54) SEMICONDUCTOR DEVICE WITH DEPLETION REGION

(76) Inventors: Guy Silver, Sunnyvale, CA (US); Juinerong Wu, Sunnyvale, CA (US)

( * ) Notice: Subject to any disclaimer, the term of this patent is extended or adjusted under 35 U.S.C. 154(b) by 1009 days.

(21) Appl. No.: 11/577,172

(22) PCT Filed: Oct. 7, 2005

(86) PCT No.: PCT/US2005/036398

§ 371 (c)(1),
(2), (4) Date: Apr. 12, 2007

(87) PCT Pub. No.: WO2006/044324

PCT Pub. Date: Apr. 27, 2006

(65) Prior Publication Data

US 2009/0026579 A1 Jan. 29, 2009

Related U.S. Application Data

(63) Continuation-in-part of application No. 10/963,357, filed on Oct. 12, 2004, now Pat. No. 7,649,496.

(51) Int. Cl.
*H01L 29/66* (2006.01)

(52) U.S. Cl. ............. 257/498; 257/E21.09; 257/E21.04; 257/E29.335

(58) Field of Classification Search .................. 257/603, 257/46, E29.166, 205, 348, 492, 498, E21.09, 257/E21.04, E29.335; 343/700 MS
See application file for complete search history.

(56) References Cited

U.S. PATENT DOCUMENTS 4,278,986 A * 7/1981 Mader ........................... 257/498
5,629,544 A 5/1997 Voldman et al.

* cited by examiner

*Primary Examiner* — Thomas L Dickey
*Assistant Examiner* — Nikolay Yushin
(74) *Attorney, Agent, or Firm* — Edward C. Kwok

(57) ABSTRACT

A rectenna capable of power conversion from electromagnetic (EM) waves of high frequencies is provided. In one embodiment, a rectenna element generates currents from two sources—based upon the power of the incident EM wave and from an n-type semiconductor, or another electron source attached to a maximum voltage point of an antenna element. The combined current from both sources increases the power output of the antenna, thereby increasing the detection sensitivity of the antenna of a low power signal. Full wave rectification is achieved using a novel diode connected to a gap in the antenna element of a rectenna element. The diode is conductive at forward bias voltage or reverse bias voltage, and rectifies the antenna signal generated by the desired EM wave received by antenna raise from The rectenna element of the present invention may be used as a building block to create large rectenna arrays.

16 Claims, 30 Drawing Sheets

800
N+
N
P
801

810
P+
P
N
811

820
N+
N
P
P+
821
822

830
N
P
N
P
...
831
832
833

840
N
P
N
P
...
841
842
843

Depletion band
Conductor

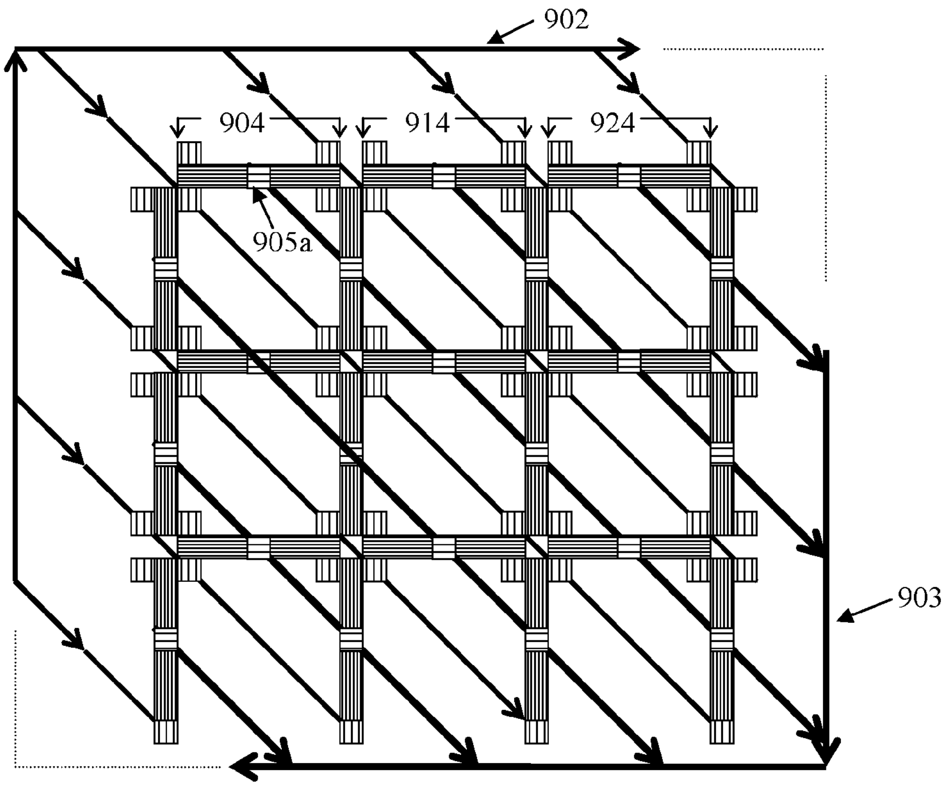
N (electron input)
N (electron output) that connects the
: P section : N section : Antenna
Side view:
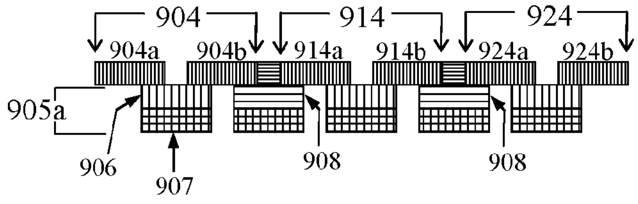
anatenna:
antenna going inside the page:
P type block of XBD:
N type channel to supply input electron to antenna :
N type block of XBD and the input/output channels:
Figure 9

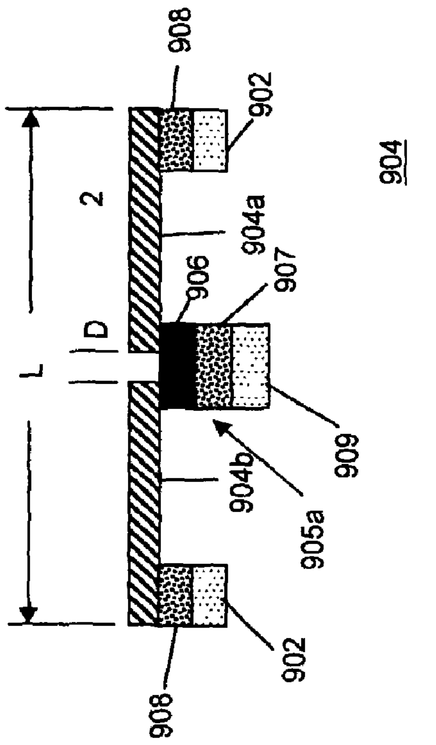
Figure 10(b)
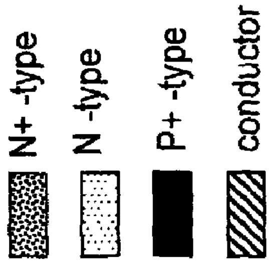
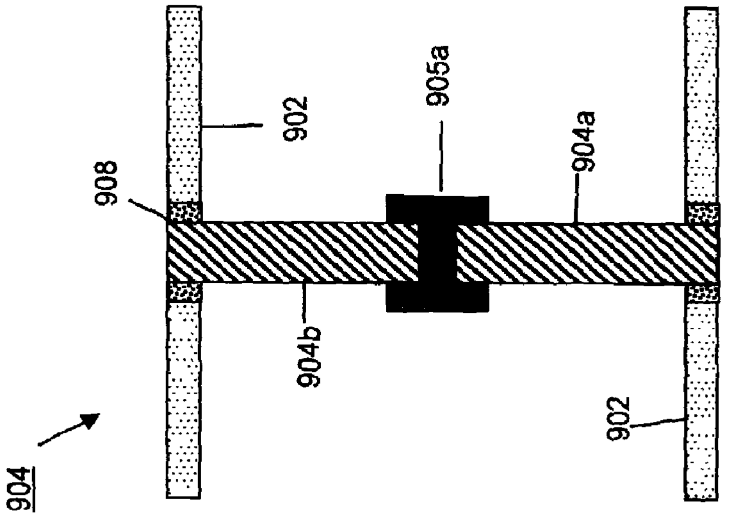
Figure 10(a)

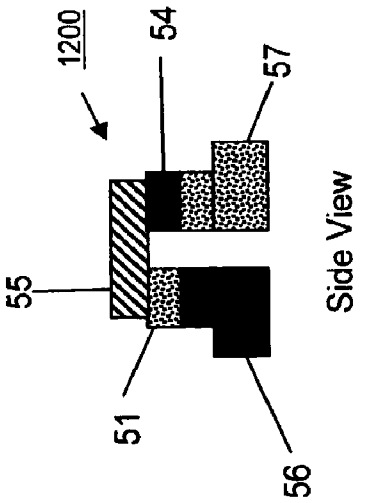
Figure 12(b)
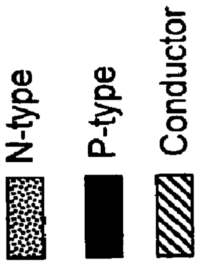
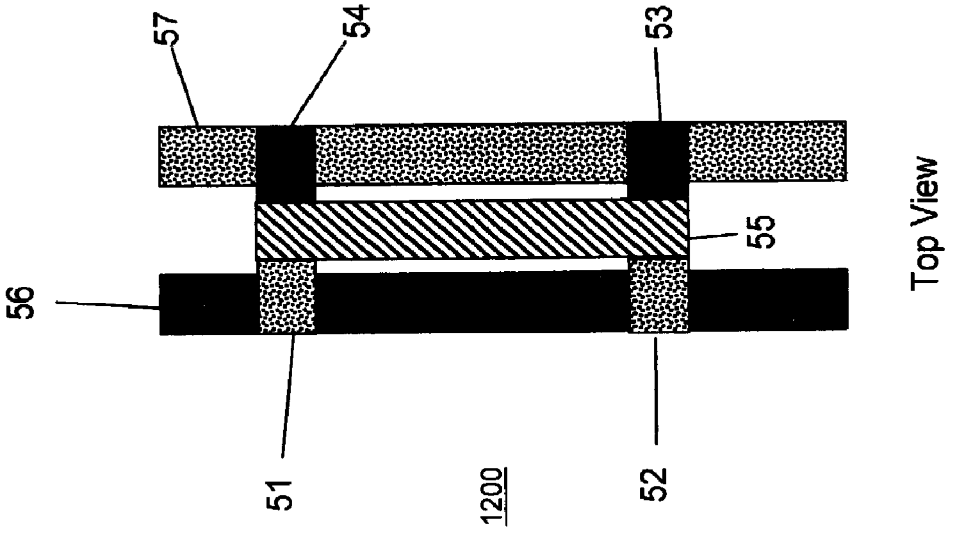
Figure 12(a)

1500
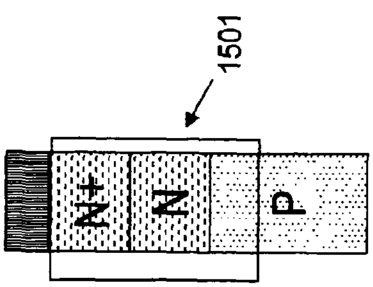
Figure 15(a)
1510
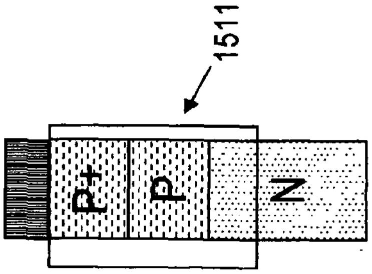
Figure 15(b)
1520
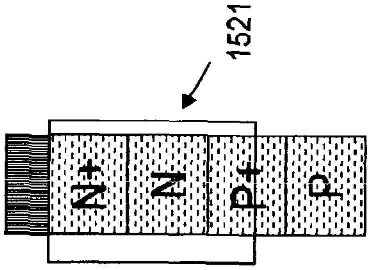
Figure 15(c)
1530
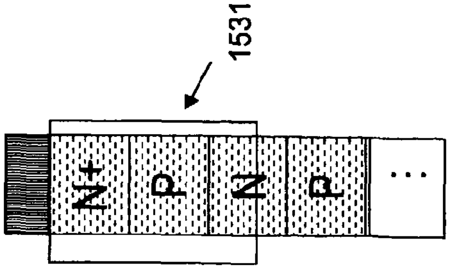
Figure 15(d)
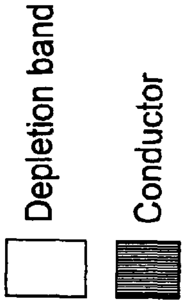

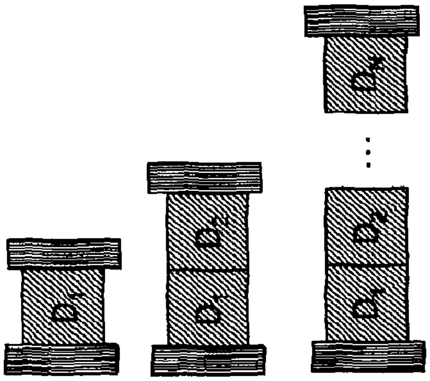
Figure 16(b)
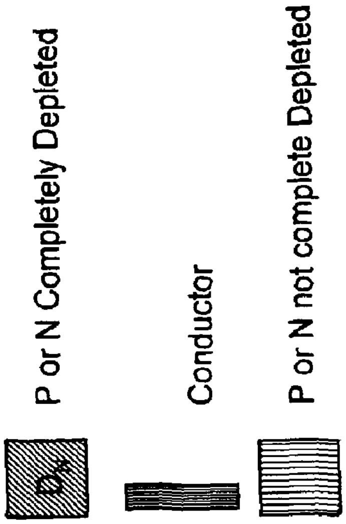
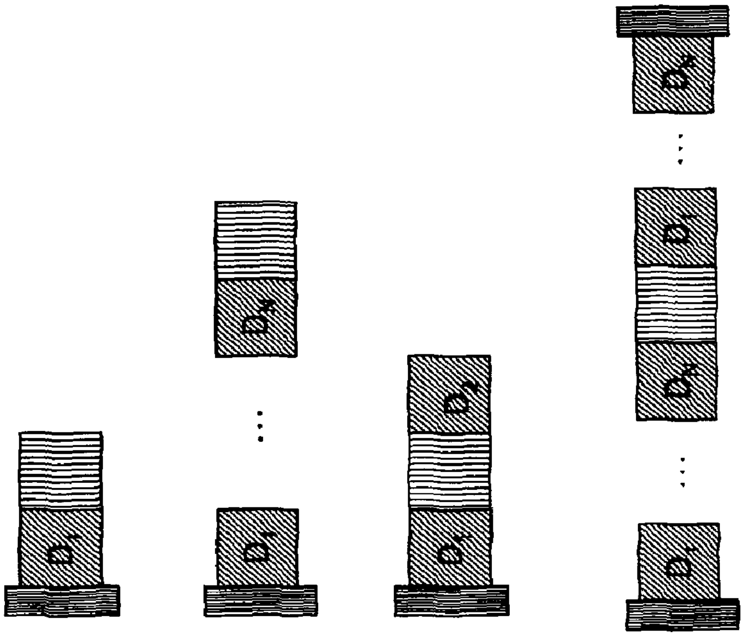
Figure 16(a)

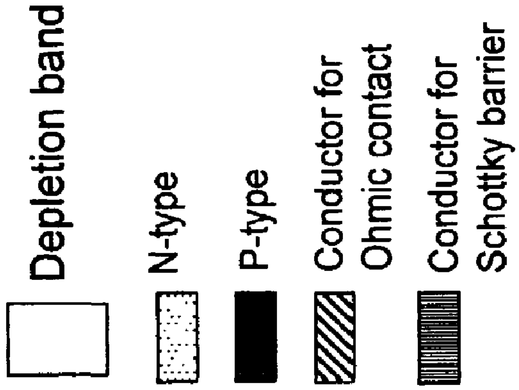
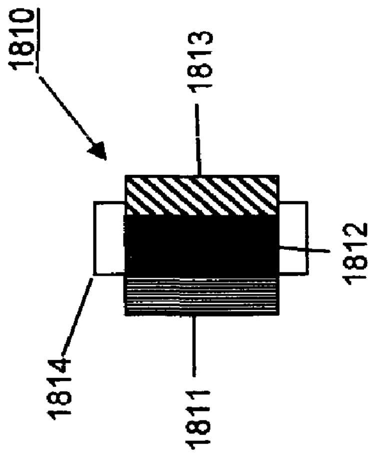
Figure 18(b)
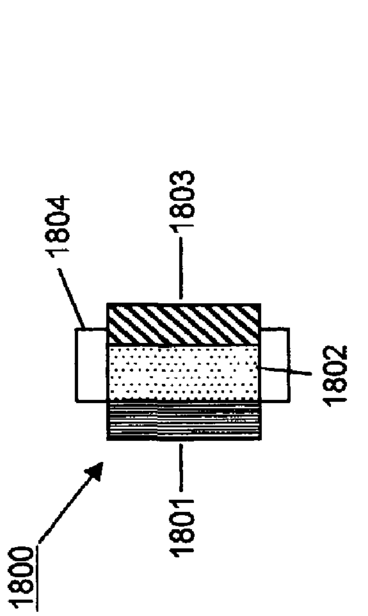
Figure 18(a)

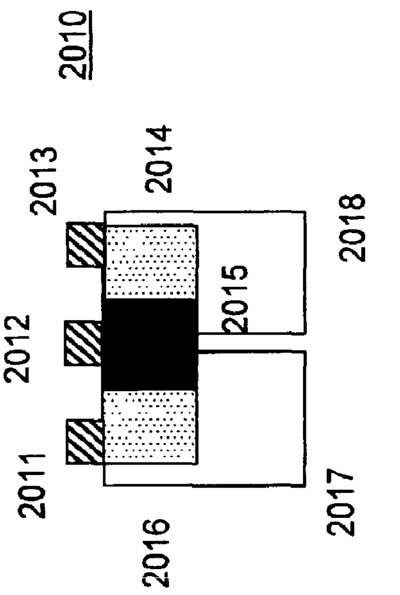
Figure 19(b)
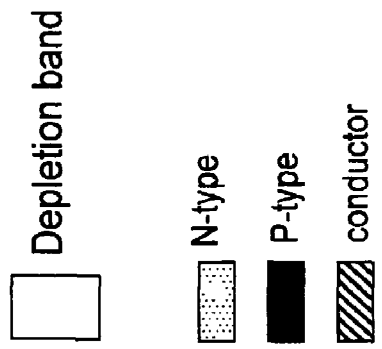
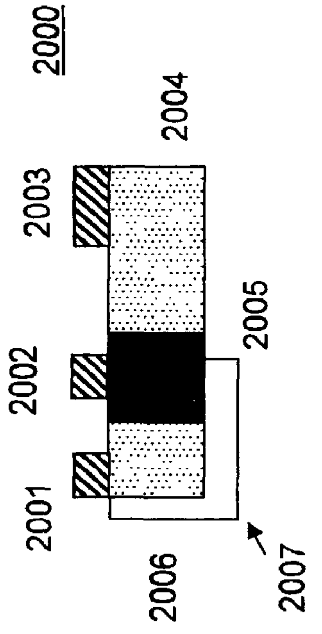
Figure 19(a)
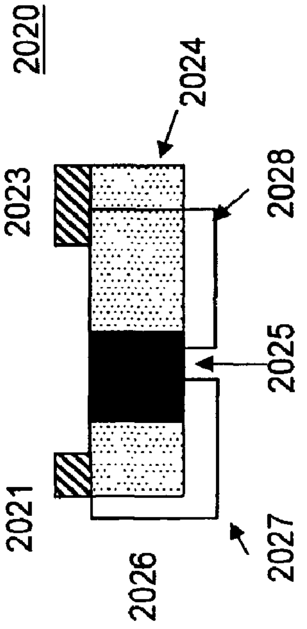
Figure 19(c)

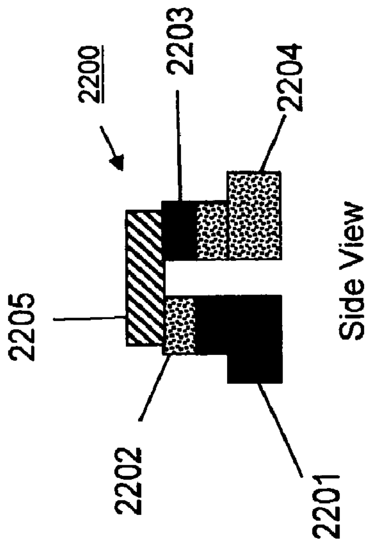
Side View
Figure 20(b)
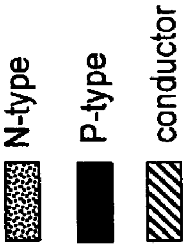
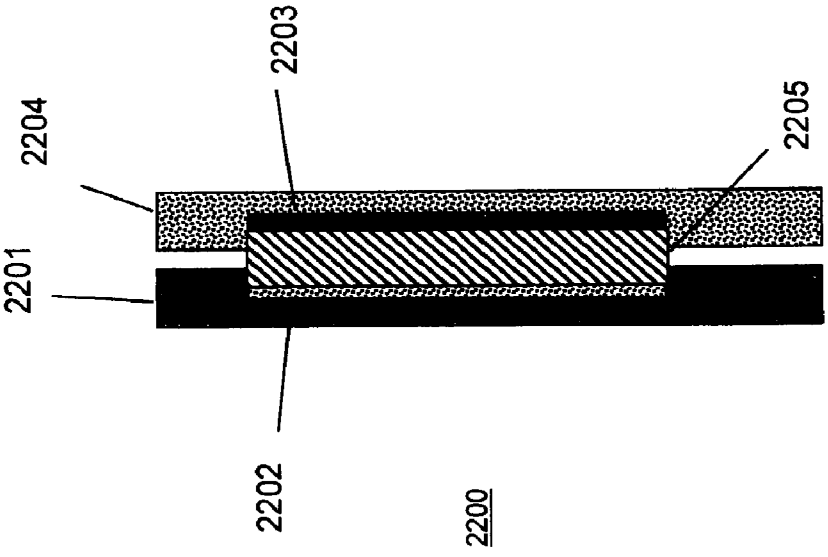
Top View
Figure 20(a)

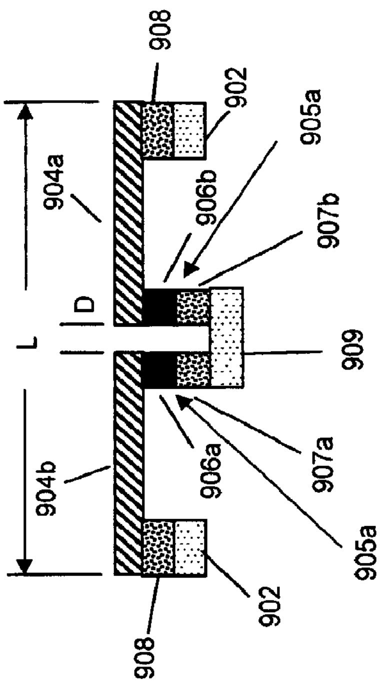
Figure 22(b)
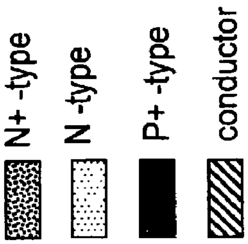
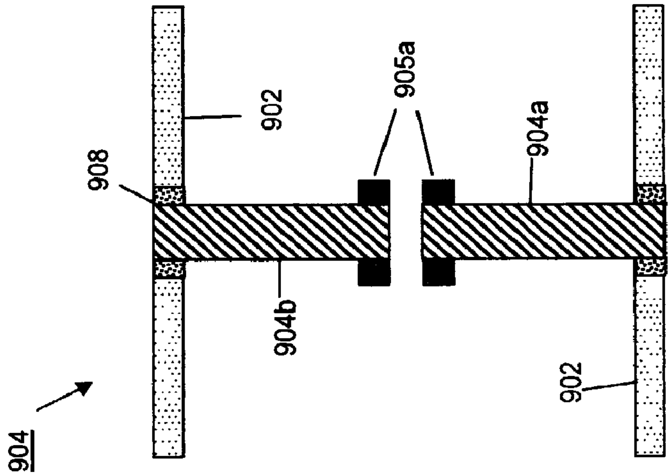
Figure 22(a)

| NBD device structure | Depleted Region Fermi Level Adjusted | Characteristics during increasing | Characteristics during decreasing biasing | Near zero reverse current with reverse potential | Maintains same forward threshold voltage |
|---|---|---|---|---|---|
| Sch \| N non-F \| Ohm | No | Depletion region smaller | Depletion region bigger | Yes | Yes |
| Sch \| N non-F \| Sch | No | - Depletion regions: Sch/N smaller, N/Sch bigger | - Depletion regions: Sch/N biggger, N/Sch smaller | No | Yes |
| Sch \| N non-F \| P \| Ohm | No | - Depletion regions: Sch/N smaller, N/P bigger | - Depletion regions: Sch/N bigger, N/P smaller | No | Yes |
| Sch \| N non-F \| P \| Sch | No | - Depletion regions: Sch/N smaller, N/P same, P/Sch smaller | - Depletion regions: Sch/N bigger, N/P same, P/Sch bigger | No | Yes |
| Ohm \| N non-F \| P \| Ohm | No | Depletion region smaller | Depletion region bigger | Yes | Yes |
| Ohm \| N non-F \| P \| Sch | No | - Depletion regions: Ohm/N same, N/P smaller, P/Sch smaller | - Depletion regions: Ohm/N same, N/P bigger, P/Sch bigger | No | Yes |
| Sch \| N non-F \| P \| N | No | - Depletion regions: Sch/N smaller, N/P same, P/N smaller | - Depletion regions: Sch/N bigger, N/P same, P/N bigger | No | Yes |
| Ohm \| N non-F \| P \| N | No | - Depletion regions: Ohm/N same, N/P smaller, P/N smaller | - Depletion regions: Ohm/N same, N/P bigger, P/N bigger | No | Yes |
| Sch \| N Forced \| Ohm | Yes | Depletion region same | Depletion region same | Yes | Yes |

Figure 27.1

<table>
<tr><td></td><td></td><td></td><td></td><td></td><td></td></tr>
<tr><td>Sch | N Forced | Sch</td><td>Yes</td><td>- Depletion regions:<br>Sch/N same, N/Sch same<br>- N fermi -> Efn</td><td>- Depletion regions:<br>Sch/N same, N/Sch same<br>- N fermi -> Efi</td><td>No</td><td>Yes</td></tr>
<tr><td>Sch | N Forced | P | Ohm</td><td>Yes</td><td>- Depletion regions:<br>Sch/N same, N/P same<br>- N fermi ->Efn</td><td>- Depletion regions:<br>Sch/N same, N/P same<br>- Charge storage</td><td>No</td><td>Yes</td></tr>
<tr><td>Sch | N Forced | P | Sch</td><td>Yes</td><td>- Depletion regions:<br>Sch/N same, N/P same, P/Sch smaller<br>- N fermi -> Efn</td><td>- Depletion regions:<br>Sch/N same, N/P same, P/Sch extra big<br>- N fermi -> same</td><td>No</td><td>No after 1 fwd inc/dec cycle Sch/N, N/P lower</td></tr>
<tr><td>Ohm | N Forced | P | Ohm</td><td>Yes</td><td>Depletion region same<br>- N fermi ->Efn</td><td>Depletion region same,<br>- Charge storage</td><td>Yes</td><td>Yes</td></tr>
<tr><td>Ohm | N Forced | P | Sch</td><td>Yes</td><td>- Depletion regions:<br>Ohm/N same, N/P same, P/Sch smaller<br>- N fermi -> Efn</td><td>- Depletion regions:<br>Ohm/N same, N/P same, P/Sch extra big<br>- N fermi -> same</td><td>No</td><td>No after 1 fwd inc/dec cycle N/P Vth smaller</td></tr>
<tr><td>Sch | N Forced | P | N</td><td>Yes</td><td>- Depletion regions:<br>Sch/N same, N/P same, P/N smaller<br>- N fermi -> Efn</td><td>- Depletion regions:<br>Sch/N same, N/P same, P/N extra big<br>- N fermi -> same</td><td>No</td><td>No after 1 fwd inc/dec cycle Sch/N, N/P lower</td></tr>
<tr><td>Ohm | N Forced | P | N</td><td>Yes</td><td>- Depletion regions:<br>Ohm/N same, N/P same, P/N smaller<br>- N fermi -> Efn</td><td>- Depletion regions:<br>Ohm/N same, N/P same, P/N extra big<br>- N fermi -> same</td><td>No</td><td>No after 1 fwd inc/dec cycle N/P Vth smaller</td></tr>
<tr><td>Sch | P non-F | Ohm</td><td>No</td><td>Depletion region smaller</td><td>Depletion region bigger</td><td>Yes</td><td>Yes</td></tr>
</table>

Figure 27.2

<table>
<tr><td>Sch | P non-F | Sch</td><td>No</td><td>- Depletion regions: Sch/P smaller, P/Sch bigger</td><td>- Depletion regions: Sch/P bigger, P/Sch smaller</td><td>No</td><td>Yes</td></tr>
<tr><td>Sch | P non-F | N | Ohm</td><td>No</td><td>- Depletion regions: Sch/P smaller, P/N bigger</td><td>- Depletion regions: Sch/P bigger, P/N smaller</td><td>No</td><td>Yes</td></tr>
<tr><td>Sch | P non-F | N | Sch</td><td>No</td><td>- Depletion regions: Sch/P smaller, P/N same, N/Sch smaller</td><td>- Depletion regions: Sch/P bigger, P/N same, N/Sch bigger</td><td>No</td><td>Yes</td></tr>
<tr><td>Ohm | P non-F | N | Ohm</td><td>No</td><td>Depletion region smaller</td><td>Depletion region bigger</td><td>Yes</td><td>No</td></tr>
<tr><td>Ohm | P non-F | N | Sch</td><td>No</td><td>- Depletion regions: Ohm/P same, P/N smaller, N/Sch smaller</td><td>- Depletion regions: Ohm/P same, P/N bigger, N/Sch bigger</td><td>No</td><td>Yes</td></tr>
<tr><td>Sch | P non-F | N | P</td><td>No</td><td>- Depletion regions: Sch/P smaller, P/N same, N/P smaller</td><td>- Depletion regions: Sch/P bigger, P/N same, N/P bigger</td><td>No</td><td>Yes</td></tr>
<tr><td>Ohm | P non-F | N | P</td><td>No</td><td>- Depletion regions: Ohm/P same, P/N smaller, N/P smaller</td><td>- Depletion regions: Ohm/P same, P/N bigger, N/P bigger</td><td>No</td><td>Yes</td></tr>
<tr><td>Sch | P Forced | Ohm</td><td>Yes</td><td>Depletion region same</td><td>Depletion region same</td><td>Yes</td><td>Yes</td></tr>
<tr><td>Sch | P Forced | Sch</td><td>Yes</td><td>- Depletion regions: Sch/P same, P/Sch same<br>- P fermi -> Efp</td><td>- Depletion regions: Sch/P same, P/Sch same<br>- P fermi -> Efi</td><td>No</td><td>Yes</td></tr>
<tr><td>Sch | P Forced | N | Ohm</td><td>Yes</td><td>- Depletion regions: Sch/P same, P/N same<br>- P fermi ->Efp</td><td>- Depletion regions: Sch/P same, P/N same<br>- Charge storage</td><td>No</td><td>Yes</td></tr>
</table>

Figure 27.3

<table>
<tr><th></th><th></th><th></th><th></th><th></th><th></th></tr>
<tr><td>Sch | P Forced | N | Sch</td><td>Yes</td><td>- Depletion regions:<br>Sch/P same, P/N same,<br>N/Sch smaller<br>- P fermi -> Efp</td><td>- Depletion regions:<br>Sch/P same, P/N same,<br>N/Sch extra big<br>- P fermi -> same</td><td>No</td><td>No after 1 fwd inc/dec cycle Sch/P, P/N lower</td></tr>
<tr><td>Ohm | P Forced | N | Ohm</td><td>Yes</td><td>Depletion region same,<br>P fermi ->Efp</td><td>Depletion region same,<br>Charge storage</td><td>Yes</td><td>Yes</td></tr>
<tr><td>Ohm | P Forced | N | Sch</td><td>Yes</td><td>- Depletion regions:<br>Ohm/P same, P/N same, N/Sch smaller<br>- P fermi -> Efp</td><td>- Depletion regions:<br>Ohm/P same, P/N same,<br>N/Sch extra big<br>- P fermi -> same</td><td>No</td><td>No after 1 fwd inc/dec cycle P/N Vth smaller</td></tr>
<tr><td>Sch | P Forced | N | P</td><td>Yes</td><td>- Depletion regions:<br>Sch/P same, P/N same,<br>N/P smaller<br>- P fermi -> Efp</td><td>- Depletion regions:<br>Sch/P same, P/N same,<br>N/P extra big<br>- P fermi -> same</td><td>No</td><td>No after 1 fwd inc/dec cycle Sch/P, P/N lower</td></tr>
<tr><td>Ohm | P Forced | N | P</td><td>Yes</td><td>- Depletion regions:<br>Ohm/P same, P/N same, N/P smaller<br>- P fermi -> Efp</td><td>- Depletion regions:<br>Ohm/P same, P/N same,<br>N/P extra big<br>- P fermi -> same</td><td>No</td><td>No after 1 fwd inc/dec cycle P/N threshold smaller, N/P larger</td></tr>
</table>

Figure 27.4

SEMICONDUCTOR DEVICE WITH DEPLETION REGION

CROSS REFERENCE TO RELATED APPLICATIONS

The present application is a National Stage application based on International Application No. PCT/US2005/036398 and is a continuation-in-part application of, and claims priority to, U.S. patent application ("Patent Application"), Ser. No. 10/963,357, entitled "EM Rectifying Antenna Suitable for use in Conjunction with a Natural Breakdown Device," filed on Oct. 12, 2004, now U.S. Pat. No. 7,649,496. The patent application is hereby incorporated by reference in its entirety.

BACKGROUND OF THE INVENTION

1. Field of the Invention

The present invention relates to an energy conversion device using rectifying antennae ("rectannae"). In particular, the present invention relates to an energy conversion device which converts electromagnetic wave energy to electrical energy using a semiconductor device that rectifies a small high frequency signal.

2. Discussion of the Related Art

FIG. 1 shows the current versus voltage characteristics of a conventional pn junction diode. FIG. 2 is a schematic representation of conventional abrupt pn junction diode 100. As shown in FIG. 2, conventional pn junction diode 100 includes p-region 101 and n-region 102. P-region 101 may be doped, for example, using a p-type dopant (i.e., electron acceptor, such as boron) and n-region 102 may be doped using an n-type dopant (i.e., an electron donor, such as phosphorus). Near the abrupt junction between p-region 101 and n-region 102, equilibrium due to the difference in electrochemical potentials of the two regions and the diffusion of charge carriers (e.g., electrons and "holes") between the two regions deplete the charge carriers to form "depletion regions" 103 and 104 in p-region 101 and n-region 102, respectively. Under a so-called "abrupt junction approximation", the widths $x_p$ of depletion region 103 and $x_n$ for depletion region 104, with an externally imposed voltage V across the pn junction, are given, respectively by:

$$x_n = \sqrt{\frac{2\varepsilon_s N_A(\phi_i - V)}{qN_D(N_A + N_D)}}$$

$$x_p = \sqrt{\frac{2\varepsilon_s N_D(\phi_i - V)}{qN_A(N_A + N_D)}}$$

where $\epsilon_s$ is the electrical permittivity of silicon, q is the charge of an electron, $\phi_i$ is the "built-in" potential of the pn junction, $N_A$ and $N_B$ are the doping concentrations of p-region 101 and n-region 102, respectively.

As shown in FIG. 1, the horizontal axis shows the voltage V across the pn junction, and the vertical axis shows the diode current $I_D$ across the pn junction. As shown in FIG. 1, when voltage V across the pn junction is greater than zero volts and greater than voltage $V_{th}$ (the "threshold voltage"), the pn junction is strongly "forward biased" and the diode current $I_D$ grows exponentially with the voltage V. When the voltage V across the pn junction is less than 0 volts, but not less than the voltage $V_{br}$ (the "breakdown voltage"), the pn junction is "reverse biased" and the diode current $I_D$ is very small. Under reversed bias, as the voltage grows in magnitude, the carriers generated increases in energy, leading to phenomena such as tunneling and impact ionization at voltage $V_{br}$. At voltage $V_{br}$, the diode current $I_D$ becomes very large and the diode has "broken down." At breakdown, the magnitude of the average electrical field (in volts per centimeter) across the pn junction is given by the empirical expression:

$$|E_{br}| = \frac{4.0\times 10^5}{1 - \frac{1}{3}\log\frac{N_D}{10^{16}}}$$

where $N_D$ is the lesser of $N_A$ and $N_B$.

SUMMARY

The present invention provides a rectifying antenna ("rectenna") capable of converting power from high frequency electromagnetic (EM) waves in free space to electrical energy. According to one embodiment of the present invention, an antenna generates currents from two sources—from a potential difference generated by an incident EM wave in the antenna, and from an n-type semiconductor or another electron source attached to a maximum voltage point of an antenna. The combined current from both sources increases the power output of the antenna, thereby increasing the detection sensitivity of the antenna of a low power signal.

According to one embodiment of the present invention, full wave rectification is achieved using a novel diode connected to an antenna. In that embodiment, the diode is conductive at a reverse bias voltage, stores charge at forward bias, and rectifies the antenna signal generated by the targeted electromagnetic (EM) radiation within a selected spectrum received by antenna. The diode and the antenna form a rectenna. In one embodiment of the present invention, half wave rectification is achieved using the diode.

The rectenna of the present invention may be used as a building block to create large rectenna arrays. Thus, microwave, sub-millimeter wave, THz wave, IR wave and visible wave applications may be found in a rectenna of this invention. A rectenna of the present invention is scalable, so that future improvements are possible with improvements of semiconductor technology, material science, device physics and antenna design. There is also no upper limit to the frequencies that can be received using such a rectenna. The present invention is applicable to EM-to-DC power generation and supply, heat shield, humidity, food production, dermatology (e.g., examination of burned skin structure without biopsy) and tomography (and other medical imaging sensing). The present invention allows T-rays replacement of Roentgen rays (X-rays) in imaging of objects, such as those used to inspect pallets in certain airport safety procedures or in drug detection procedures. The present invention is also applicable to chemical analysis using flames and gases (e.g., toxicity analysis, Fourier spectrum), quality control procedures (e.g., detection of holes in plastic parts, such as those used in automobile applications), and radar applications (e.g., measurement of reflection)

According to another aspect of the present invention, a "natural breakdown device" ("NBD") allows current to flow even with a zero bias voltage. NBD is a natural breakdown device of the diode type, according to one embodiment of natural breakdown invention. An NBD may be used as a rectifier on the rectenna of the present invention to rectify small amplitude high frequency electromagnetic signals.

The present invention is better understood upon consideration of the detailed description below and the accompanying drawings.

BRIEF DESCRIPTION OF THE DRAWINGS

FIG. 6(*b*) shows an NBD 600 that has both p-type and n-type regions fully depleted at zero bias voltage, according to one embodiment of the present invention.

FIG. 9 shows rectenna array 900 including numerous antennae (e.g., antenna 904, 914 and 924) constructed in accordance with one embodiment of the present invention.

FIGS. 10(*a*) and 10(*b*) show top and side views of one embodiment of the invention, illustrating gap dipole antenna 904 in rectenna array 900 of FIG. 9, in accordance with one embodiment of the present invention.

FIGS. 12(*a*) and 12(*b*) show, respectively, the top and side views of gapless dipole antenna 1200, in accordance with one embodiment of the present invention.

FIG. 15(*a*) to 15(*d*) shows schematic representations of various NBDs at zero applied voltage bias, according to one embodiment of the present invention.

FIG. 16(*a*) to 16(*b*) shows, schematic representations of various configurations of NBDs at zero applied bias voltages, according to one embodiment of the present invention.

FIG. 18(*a*) is a schematic representation of NBD 1800 at zero applied bias voltage, according to one embodiment of the present invention; NBD 1800 represents a natural breakdown Schottky diode under a forced depletion condition.

FIG. 18(*b*) is a schematic representation of NBD 1810 at zero applied bias voltage, according to one embodiment of the present invention; NBD 1810 represents a natural breakdown Schottky diode under a forced depletion condition.

FIG. 19(*a*) is a schematic representation of NBD 2000 at zero applied bias voltage, according to one embodiment of the present invention; NBD 2000 represents an NPN bipolar transistor with one region under a forced depletion condition.

FIG. 19(*b*) is a schematic representation of NBD 2010 at zero applied voltage bias, according to one embodiment of the present invention; NBD 2010 represents a natural breakdown NPN bipolar transistor having two regions under a forced depletion conditions.

FIG. 19(*c*) is a schematic representation of NBD 2020 at zero applied voltage bias, according to one embodiment of the present invention; NBD 2020 represents a natural breakdown NPN device with one region fully depleted.

FIGS. 20(*a*) and 20(*b*) show, respectively, the top and side views of gapless dipole rectenna element 2200, in accordance with one embodiment of the present invention.

FIGS. 22(*a*) and 22(*b*) show rectifier structure 905*a* provided for signal rectification, according to one embodiment of the present invention.

FIG. 25(*b*) shows the current-voltage (IV) characteristics of NBD 300 utilizing degenerate material when the voltage $V_s$ is close to threshold voltage $V_{th}$.

FIGS. 27.1 to 27.2 are tables of various NBD structures with their corresponding characteristics.

DETAILED DESCRIPTION OF THE PREFERRED EMBODIMENTS

Figure 1:
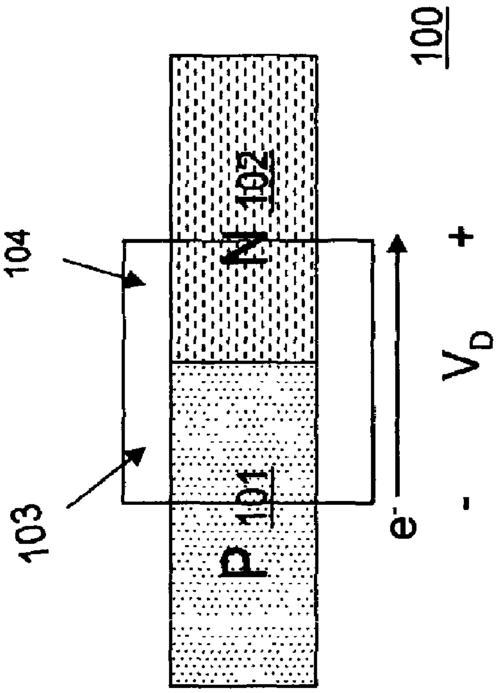
FIG. 1 shows the current (I) versus voltage (V) characteristics of a conventional pn junction diode.
Figure 2:
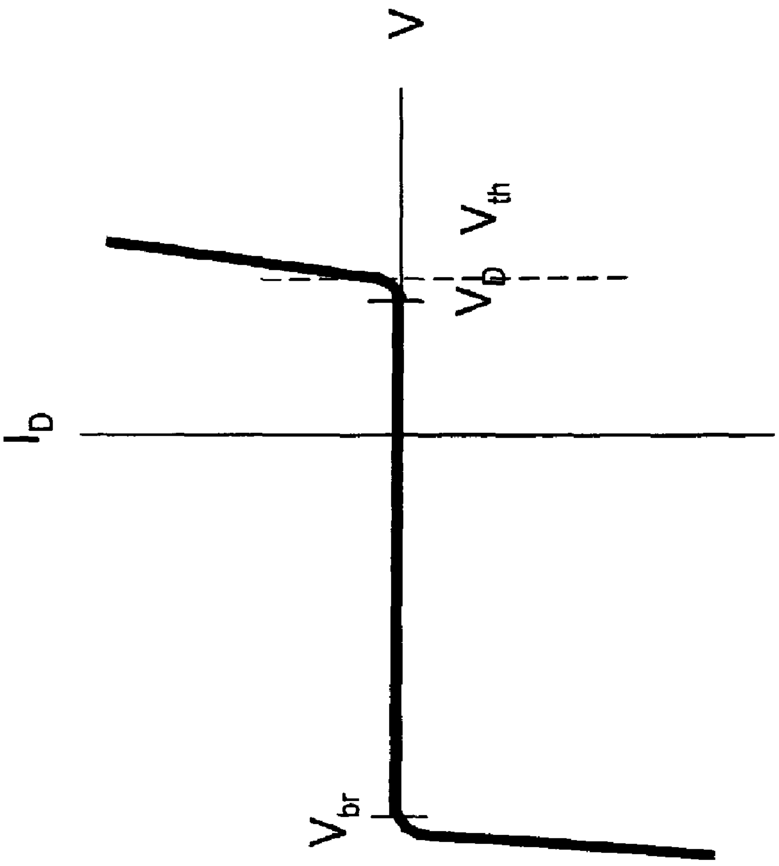
FIG. 2 is a schematic representation of conventional pn junction diode 100.

While the following description discloses mainly dipole rectangular antenna ("rectenna") elements in square array configurations (i.e., two-dimensional antenna arrays each having the same number of antenna elements along each dimension), the present invention is applicable to rectennae of other configurations, such as a two-dimensional configuration having different number of antenna elements along the two dimensions. The present invention provides an array of dipole rectennae elements configured to capture and harvest electromagnetic energy for power generation.

One embodiment of the present invention is shown in FIG. 9. FIG. 9 shows rectenna array 900 including numerous antennae (e.g., antennae 904, 914 and 924). FIGS. 10(*a*) and 10(*b*) are top and side of rectenna array 900 of FIG. 9, showing dipole antenna 904, which includes antenna sections 904*a* and 904*b* contacting rectifier structure 905*a*. Rectifier structure 905*a* rectifies the signal received at antenna 904*a* and 904*b*. Rectifier structure 905*a* may be provided, according to this embodiment of the present invention, by a "natural breakdown device" (NBD), which is further discussed below in this detailed description and referred to as a "Natural Breakdown Device" (NBD) or), a natural breakdown PN junction diode.

As shown in FIGS. 10(*a*) and 10(*b*), rectifier structure 905*a* includes an NBD which includes p-region 906 and n-region 907. P-region 906 has a width that is fully depleted at a zero bias voltage condition. In this description, when a depletion region has a width that is smaller than the width of the depletion at zero applied voltage bias at an abrupt junction for the same doping concentrations, that depletion region is said to be "forced". The forced depleted p-region 906 of rectifier structure 905*a* connects directly to the antenna. The n-region 907 of rectifier structure 905*a* connects directly to an output channel 909. Rectifier structure 905*a* may also be provided by two NBDs, according to one embodiment of the present invention, as shown in FIGS. 22(*a*) and 22(*b*). Using two NBDs, each connected to a different one of the antenna sections 904*a* and 904*b*, shorting of the antenna sections by the NBD may be avoided.

Some rectifier qualities of rectifier structure, such as 905*a*, which allow dipole antenna 904 and other antennae presented in the present invention operate efficiently include: (1) being conducting near zero reverse bias voltage or near zero forward bias voltage. (2) having a current that is significantly greater than a leakage current of a conventional pn-junction diode in reverse bias, (3) rectifying input signal by producing a current in a predetermined direction, and (4) when the rectifier structure is connected with an voltage source, the input voltage is raised.

As shown in FIG. 10(*b*), each dipole antenna 904 has a length L and is made up from two antenna sections (e.g., sections 904*a* and 904*b*) separated in the center of the antenna by a gap of length D. Length L is ideally one-half the wavelength of the electromagnetic (EM) wave that antenna is designed to receive, D is typically significantly smaller than the smallest wavelength of the electromagnetic (EM) wave the antenna is expected to receive. P-region 906 of rectifier structure 905*a* (NBD 300) is connected, on one side, next to the gap of antenna 904, to both sections 904*a* and 904*b* and, on the other side, to n-region 907. Heavily doped n+-regions 908 connect to both ends of antenna 904. A rectenna element is thus formed by antenna 904, rectifier structure 905*a*, and n+-regions 908. N+-regions 908 of multiple rectenna elements are connected to constitute input channel 902 for electrons. Similarly, heavily doped n+-regions 909 connect the n-regions of multiple rectifier structures (e.g., n-region 907 of rectifier structure 905*a*) in parallel to form output channel 903 for electrons. Antenna sections of each antenna are isolated from the antenna sections of other antennae, so that each antenna may attain whatever voltage level due to the EM wave incident to that antenna. N+ regions 908 and electron input channel 902 have the same conductivity type. In another embodiment, n+-regions 908 and 902 may be replaced by heavily doped p+-regions.

When an EM wave of wavelength 2L is received by the dipole antenna, a voltage difference is created between the ends of the antenna sections. Relative to the anode portion of the rectifier structure at the center of the dipole antenna, the voltages at the opposite ends of the dipole antennae are at opposite polarities. The resistances between n+-regions 908 to antenna 904 and between antenna 904 and the NBD are very small. The voltage difference causes electrons to flow in both antenna sections from n+-regions 908 of FIG. 10 to rectifier structure 905*a*. This is the first source of electron current in rectifier structure 905*a*. The second source of electron current in rectifier 905*a* is the electron current induced in the antenna by the magnetic field of the EM wave. This electron current has a magnitude that depends on the power of the incident EM wave. The direction of each source of electron currents at any given time is determined by the phase of the EM wave. In this configuration, the two sources provide electron currents to the dipole antenna. Maximum currents in both antenna sections occur at the center of the dipole antenna. The gap length D of antenna 904 is designed to be much smaller than ¼ the wavelength of the EM wave that antenna 904 is designed to receive. Ideally, each of antenna sections 904*a* and 904*b* is less than ¼ the wavelength of the EM wave being received. The magnitude of the current from n+-regions 908 is determined by the magnitude of the voltage difference and the magnitude of resistance between the junction of the n+-region and the contacting antenna section of the dipole antenna.

Figure 3:
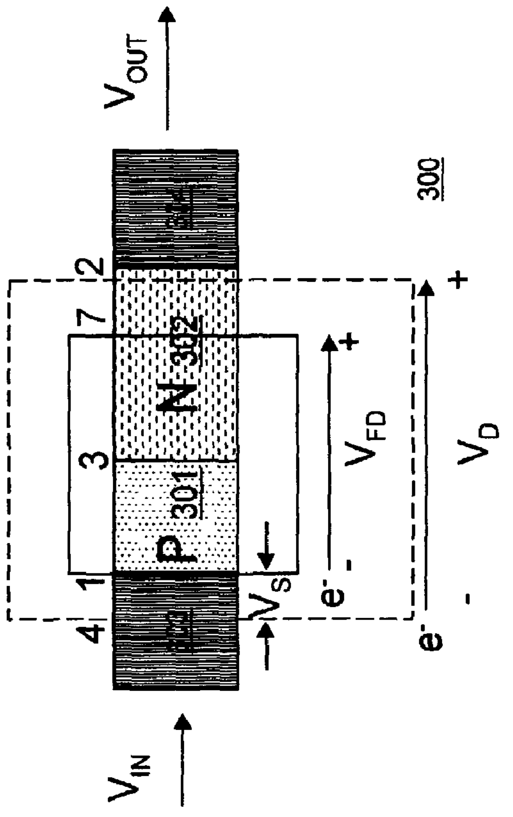
FIG. 3 is a schematic representation of a natural breakdown device (NBD) 300, according to one embodiment of the present invention.

In this configuration, where the rectifier structure at the center of the dipole antenna is an NBD similar to that discussed for NBD 300 of FIG. 3, the electron currents in the dipole antenna are shunted by the NBD 300 to the output channel (e.g., output channel 903). Rectifier structure may be provided by other similar devices. As explained below, the NBD has a raised voltage at the output channel, thus the electron currents of multiple antennae are summed at electron output channel 903. For example, on a dipole antenna as shown in rectenna array 900 of FIG. 9, an electron current from electron input channel 902 flows to the n-regions (e.g., n+ regions 908 of FIG. 10) surrounding the antenna sections, through the antenna sections to the NBD 300s, and from there the electron current flows to electron output channel 903. Thus, rectenna array 900 may be seen as a battery providing a voltage (i.e., the voltage across the NBD) between electron input channel 902 and electron output channel 903. DC power is collected along the N-type channels diagonally and each center NBD of gap rectenna. Extra electrons are supplied by the connections of n-type channels diagonally at the ends of the antenna. The alternative embodiment shown in FIGS. 22(*a*) and 22(*b*) perform similarly.

[1] In this description, when a device requires a diode similar to NBD 300 discussed in FIG. 3, the required diode is referred as "NBD 300". Similarly, when a device requires a diode similar to NBD 600 of FIG. 6, the required diode is referred as "NBD 600".

Figure 11:
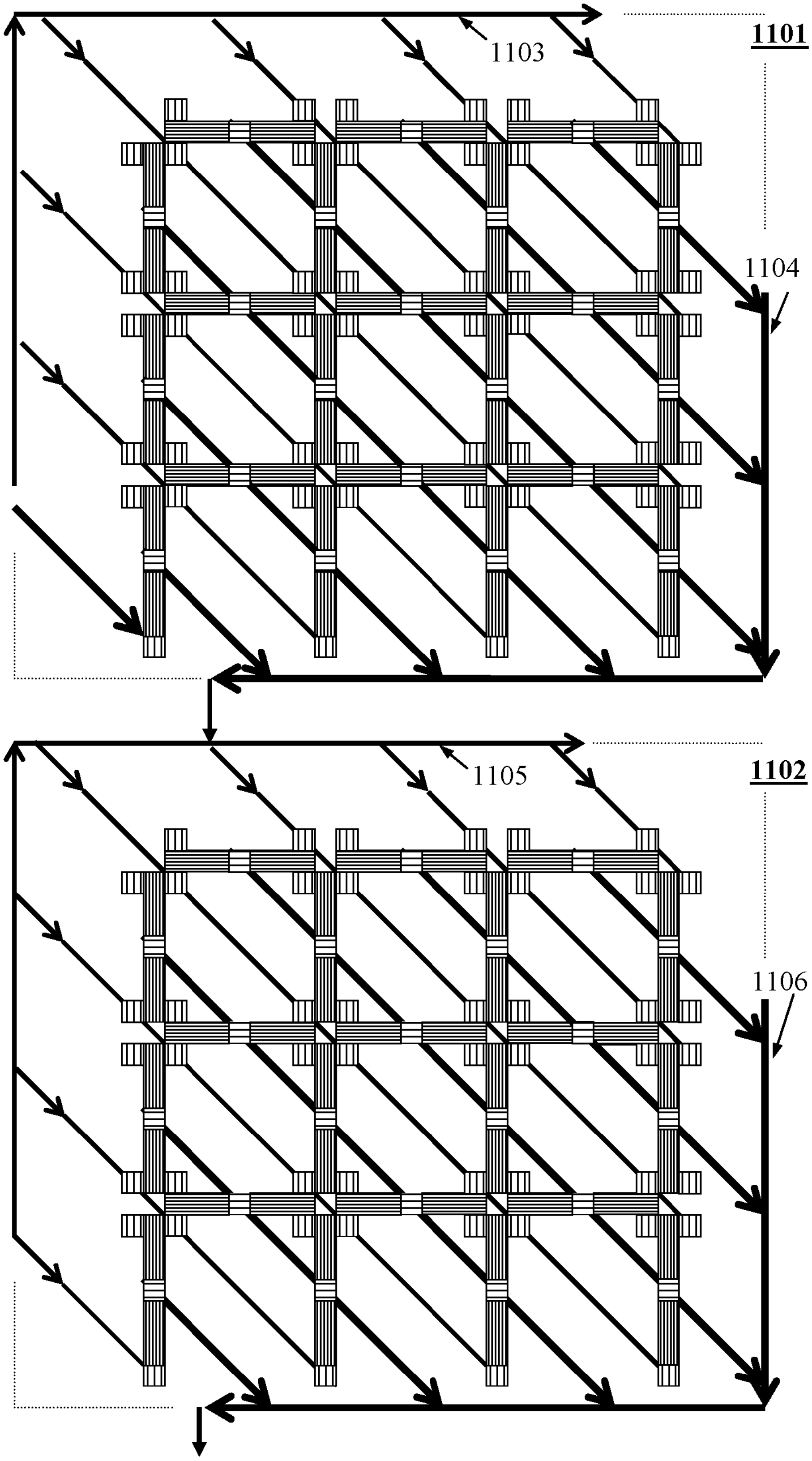
FIG. 11 shows gap rectenna arrays 1101 and 1102 connected in series for DC power collection, showing electron output channel 1104 of rectenna array 1101 being connected to electron input channel 1105 of rectenna array 1102.

FIG. 11 shows rectenna arrays 1101 and 1102 connected in series by connecting electron output channel 1104 of rectenna array 1101 to electron input channel 1105 of rectenna array 1102. Thus connected, rectenna arrays 1101 and 1102 may be seen as a battery having a voltage that is twice the NBD voltage between electron input channel 1103 and electron output channel 1106. In this manner, multiple rectenna arrays may be connected to provide a device having a voltage that is N times the NBD voltage, where N may be any positive integer greater than or equal to 1. Alternatively, rectenna arrays 1101 and 1102 may be connected together in parallel if they have the same output voltage, with electron input channels 1103 and 1105 connected together and electron output channels 1104 and 1106 connected together, to create a device having twice the current of an individual rectenna array.

As explained below, an NBD may be used to detect and rectify very high frequency signals. Accordingly, by detecting and rectifying very high frequency EM waves efficiently, the present invention provides a device for detecting and converting into DC power using frequencies of the EM spectrum that are hitherto impractical or impossible to use for a power conversion application, such as frequencies higher than the visible spectrum. The present invention finds applications in power conversion applications using a wide range of EM wave frequencies, such as infra-red (IR) and visible light (e.g., solar energy). The present invention may be utilized as a fast response photo-sensor in optical sensing and optical networks. The antenna in each rectenna element (or rectenna) can be any size and any shape of any type. A rectenna array can be configured out of many different rectenna elements. Also, each rectenna array can be different from the rectenna arrays of FIGS. 9 and 11. The rectenna array of the present invention collects the electrons current flowing from all the input channels of the rectenna elements to all the output channels of the rectenna elements. The fully depleted region of an NBD is directly connected to the antenna.

The presence of a gap in each dipole antenna limits the highest frequency under which a rectenna (or a rectenna array) of the present invention may operate. According to one embodiment, a gapless dipole antenna is shown in top and side views in FIGS. 12(*a*) and 12(*b*), respectively. NBD 600 may be used as an input NBD for gapless dipole antenna, which is further discussed below in this detailed description. As shown in FIGS. 12(*a*) and 12(*b*), antenna 55 of dipole antenna 1200 is connected to two NBDs (formed by p-regions 53 and 54 and n-region 57), forming an electron output terminal on one side, and to two NBDs (formed by p-region 56 and n-regions 51 and 52), forming an electron input terminal on the other side. In other words, a rectenna element 1200 is formed by antenna 1200, two NBDs for input at an electron input terminal and two NBDs for output at an electron output terminal. A voltage difference between the electron input terminal and the electron output terminal of a dipole rectenna element 1200 is provided by the sum of the voltages across the two NBDs. Thus, dipole antenna 1200 has a resolution of two NBDs, which is twice the resolution of dipole antenna 904 of FIGS. 9 and 10. When an EM wave impinges on the antenna, a voltage difference is created between the ends of this antenna. The voltages at the opposite ends of the dipole antenna are of opposite polarities. The end of the antenna having the positive voltage will have electron flow induced from the input NBDs to the output NBDs because the resistance between NBD 300s and the antenna 55 is very small. The input NBDs are provided for electron input. The output NBDs provide a rectifier structure. The input NBD directs the electrons from the electron input channels to the antenna. The output NBD serves as a rectifier structure for antenna signals. The output NBD has a forced depleted p-region that connects directly to antenna. NBD 300 may be used as an output NBD because the p-region that connects to the antenna section is a force depleted region. The output NBD is not required to have a forced depleted p-region, according to one embodiment of the present invention. A non-forced NBD[2] may be used. Unlike a forced depleted p-region, a non-forced depletion region does not rectify the electron current at forward bias. The n-region of an input NBD can be either a non-forced depleted region or a forced depleted region. The forced depleted input NBDs will build up electrons at forward bias and deliver better rectenna efficiency than the non-forced depleted input NBDs. N-region of NBD 600 is forced depleted and may be used as an input NBD for gapless rectenna design. N-region of non-forced NBD 600 is non-forced depleted and may be used as an input NBD for a gapless rectenna design. The fully depleted regions of input NBDs or output NBDs are directly connected to the antennae.

[2] As discussed below, the term non-forced NBD refers to an NBD having a width in one region that is exactly equal to the depletion width of the corresponding conductivity type in an abrupt P-N junction of the same dopant concentrations.

The phase of the EM wave determines which end of the antenna has an electron current. In this configuration, there is only one current source for the antenna (rectenna or rectenna element). The source of electron current is the p+-regions at the end of the antenna next to the input NBDs (e.g., p+-region 56 of FIGS. 12(*a*) and 12(*b*)). The magnitude of the current from the p+-regions is determined by the voltage difference and the resistance between the junction of the p+-region and the contacting antenna section of the gapless antenna. The DC voltage at both ends of antenna element 55 is equal to the NBD voltage, relative to either the input terminal or the output terminal or dipole rectenna element 1200. The NBD can raise output voltage for signals at reverse bias. If the voltage induced by the EM wave on antenna 55 is within this input voltage range, then the voltage difference between antenna 55 and output n-channel 57 is raised. Therefore, a small signal of the EM waves may be rectified for suitable applications which were not achievable by other rectenna. DC power is collected by connecting the n-type channels under the output NBDs (p-regions 53 and 54 in FIG. 12(*a*)). Extra electrons are supplied by the connections of P-type channels under the input NBDs. When two gapless antennae are lined up end to end with a separation distance D then this antenna pair will operate like a single gap antenna as described above. This is because the input NBDs at the far ends of the gapless antenna pair act like the gap antenna n+-type input channel and the two output NBDs in the center of the gapless antenna pair act as the center output NBD of the gap antenna.

Figure 13:
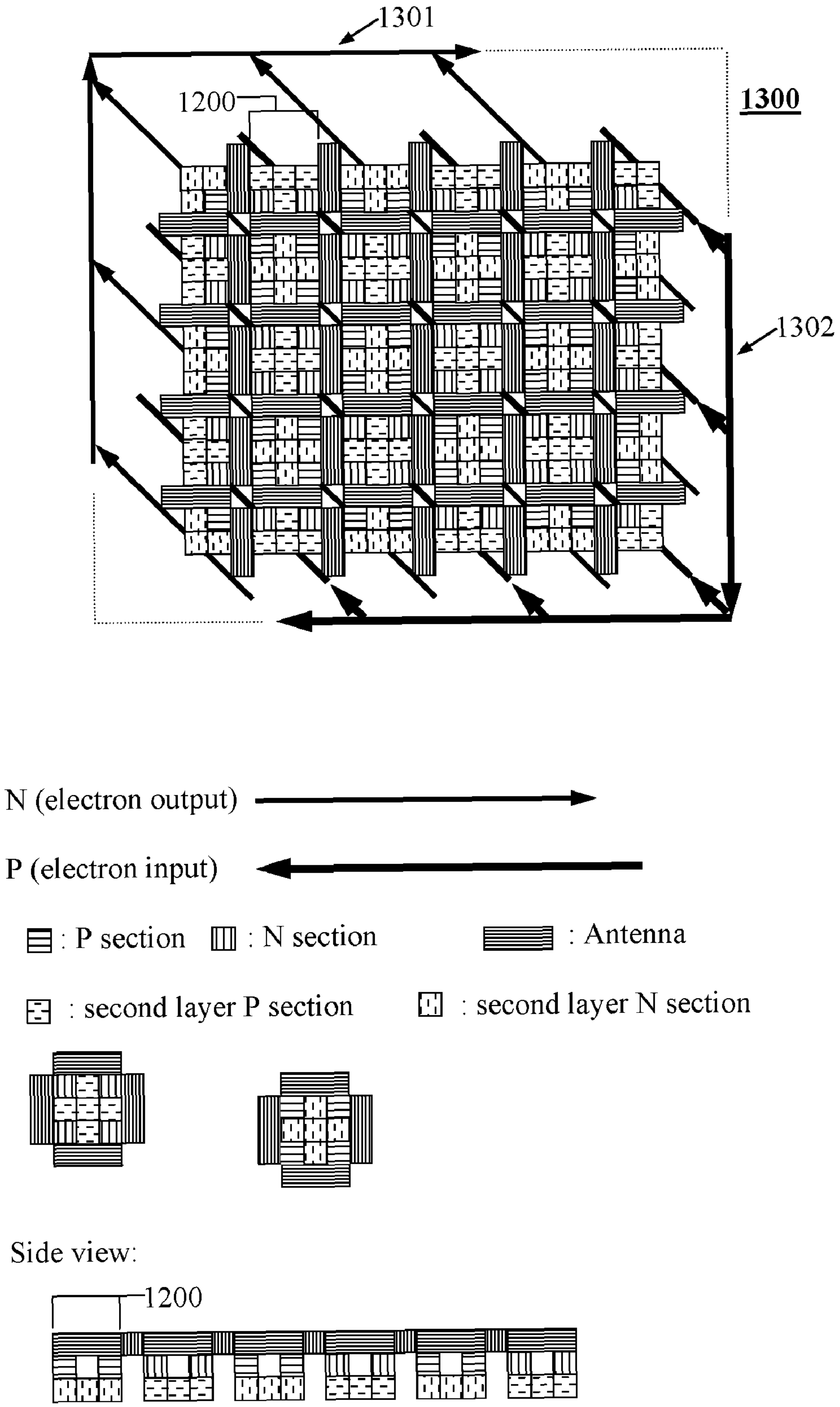
FIG. 13 shows rectenna array 1300 including numerous gapless antennae.
Figure 14:
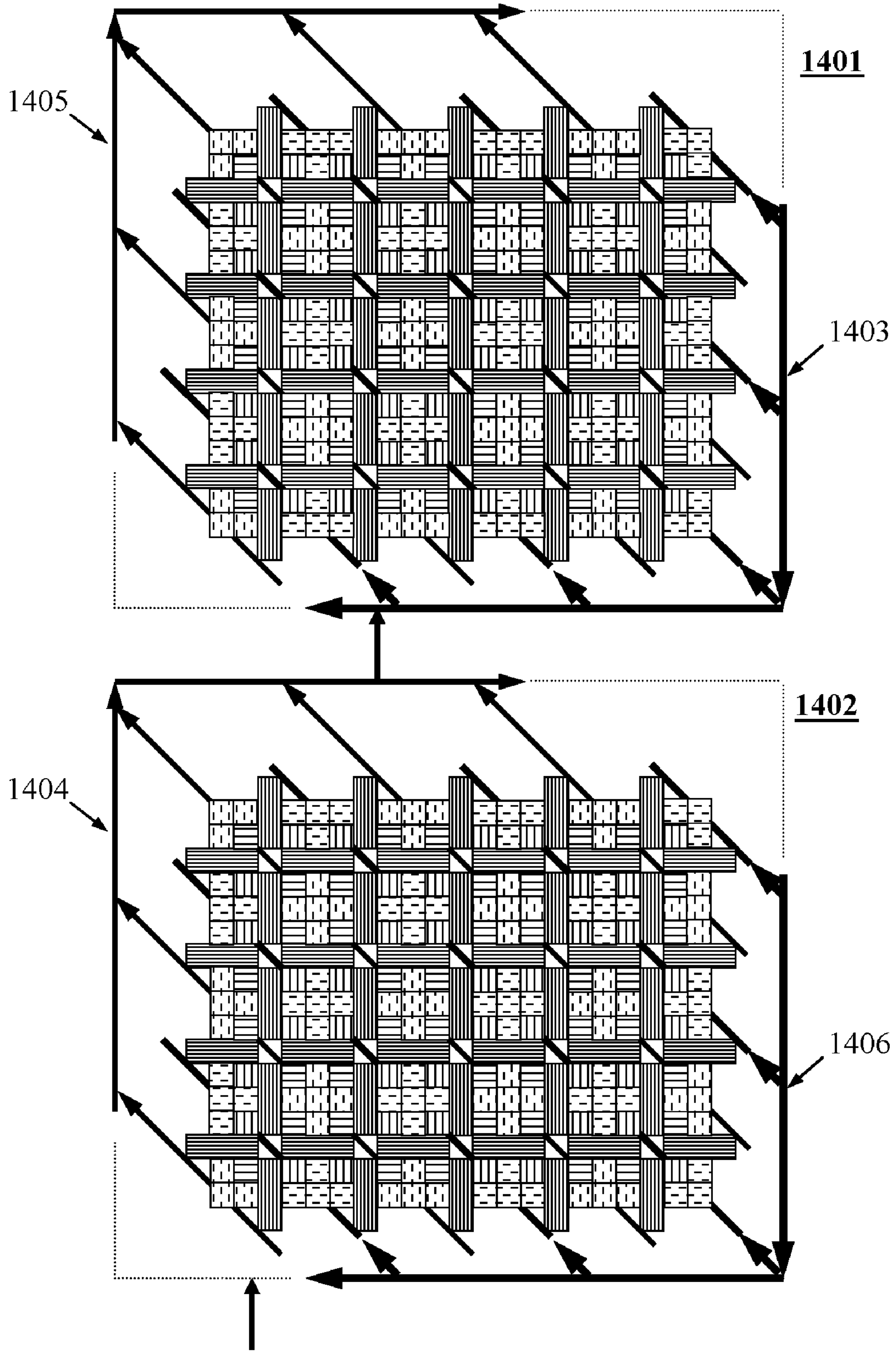
FIG. 14 shows rectenna arrays 1401 and 1402 connected in series for DC power collection, showing electron output channel 1404 of rectenna array 1402 being connected to electron input channel 1403 of rectenna array 1401.

FIG. 13 shows rectenna array 1300 including numerous gapless dipole antennae (e.g., antenna 1200 of FIG. 12) with their respective electron input terminals connected together to form electron input channel 1302 and their respective electron output terminals connected to form output channel 1301. Numerous such rectenna arrays may be connected in series or in parallel, as shown in FIG. 14. As shown in FIG. 14, electron output channel 1404 of rectenna array 1402 is connected serially with electron input channel 1403 of rectenna array 1401 through a metal trace (not shown) to provide current at twice the output voltage of the individual rectenna array. The metal trace prevents the electron input channel (p-type) and electron output channel (n-type) from forming a pn-junction, as a pn junction causes an undesirable voltage drop. Rectenna array 1401 and rectenna array 1402 can be connected in parallel by having electron input channels 1403 and 1406 connected together and electron output channels 1405 and 1404 connected together. Connecting two of the same rectenna arrays in parallel provides twice the current of an individual rectenna array.

Input device such as the NBDs provided for electron input may be provided by similar devices. Gapless rectenna element 1200 provides full wave rectification. In one embodiment, rectenna element may include an input NBD and an output NBD at two ends of the antenna for half-wave rectification. Alternatively, half-wave rectification may be achieved using either one input NBD (e.g., NBD 51) and one output NBD (e.g., 53), or one input NBD (e.g., NBD 52) and output NBD (e.g., NBD 57). In other words, a rectenna element is formed by antenna 1200, either one NBD (e.g., NBD 51) for electron input at an electron input terminal and one NBD (e.g., NBD 53) for electron output at an electron output terminal, or one NBD (e.g., NBD 52) for electron input at an electron input terminal and one NBD (e.g., NBD 57) for electron output at an electron output terminal.

Gapless rectenna element 1200 collects current between the electron input channels and the output NBDs. Another gapless antenna 2200 utilizes two sources of current, similar to gap antenna 904, according to another embodiment of the present invention. Dipole antenna 2200 is shown in top and side views in FIGS. 20(*a*) and 20(*b*), respectively. As shown in FIGS. 20(*a*) and 20(*b*), antenna 2205 of dipole antenna 2200 is connected to an NBD formed by p-regions 2203 and n-region 2204, forming an electron output terminal on one side, and to an NBD formed by p-region 2201 and n-regions 2202, forming an electron input terminal on the other side. The NBD formed by p-regions 2203 and n-region 2204 is a rectifier structure, in either of p-region 2203 and n-region 2204 can be a forced depleted region or non-forced depleted region. The NBD formed by p-region 2201 and n-regions 2202 drives electrons to the antenna 2205, and may be implemented by an NBD, such as NBD 600 discussed below. A rectenna element includes antenna 2205, an electron input terminal and an electron output terminal. DC power is collected by connecting n-type channels under the output NBD (e.g., n-regions 2204 in FIG. 20(*a*)). Extra electrons are supplied by connecting p-type channels under the input NBD. The input terminals of rectenna elements are connected together and the output terminals of rectenna elements are connected together to form the rectenna array.

Figure 21:
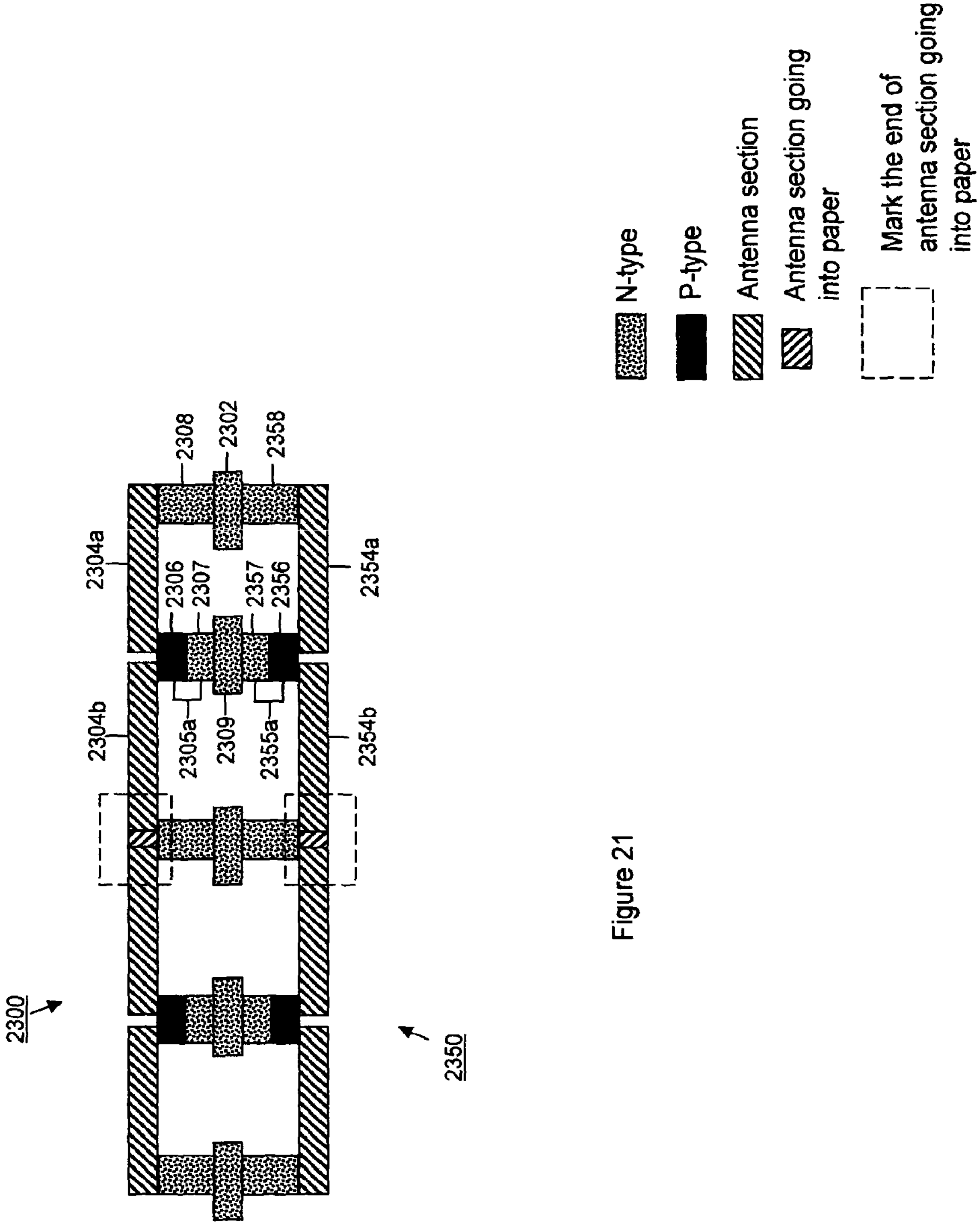
FIG. 21 shows, gap rectenna arrays 2300 and 2350 connected in parallel, according to one embodiment of present invention.

FIG. 21 shows gap rectenna arrays 2300 and 2350 connected in parallel in one package such that input channels and output channels are shared by both rectenna arrays. The sharing of input and output channels is shown in FIG. 21 by input channel 2302 and output channel 2309. Rectifiers 2305*a* and 2355*a* output electrons to output 2309 and n-regions 2308 and 2358 receive electrons from input channel 2302. Using this type of packaging provides a higher density design providing a way to increase the received EM wave bandwidth and power output. Non-gap rectenna arrays can also be arranged in parallel similarly. Full-wave rectification results from using a forced NBD in such an rectenna design. However, using a non-forced NBD achieves half-wave rectification. To perform a full-wave rectification using two half-wave rectifications, antenna 2304*a* and antenna 2304*b* each connects to a separate 2305*a* which connect to output channel 2309, and antenna 2354*a* and antenna 2354*b* each connects to a separate 2355*a* which connect to output channel 2309.

According to one embodiment of present invention, full-wave rectification can be achieved using an NBD for a gap dipole antenna, while half-wave rectification can be achieved using a non-forced NBD. According to one embodiment of present invention, full-wave rectification can be achieved by using either a forced or a non-forced NBD (e.g., NBD 300) for rectifiers, but using a forced or non-forced NBD (e.g., NBD 600) for electron input with gapless dipole antenna. Full-wave rectification may also be achieved by using two half-wave rectifications, according to one embodiment of the present invention.

Rectifier structures of the EM rectenna of the present invention may include different numbers and types of NBDs, according to one embodiment of the present invention. These NBDs of a rectifier can be connected in series, in parallel or both. Therefore, the rectifier structures of the EM rectenna can be in different configurations depending on the requirements of the desired result or performance. When the input voltage is varied within a predetermined negative bias voltage range of a NBD, the output voltage of a NBD may be higher than the input voltage by a substantially constant value. This means that the output voltage of an antenna can be raised by a DC voltage when the rectifier has serially connected NBDs. Similarly, the output current of an antenna can be regulated when rectifier has NBDs connects in parallel. By varying the output voltage or current, a variation of the EM rectennae can be provided to meet different needs and to achieve different efficiencies.

Rectifier structures of the EM rectenna of the present invention may use other devices for rectification instead of NBDs according to one embodiment of the present invention. Other rectifying devices include Schottky diodes, back diodes and tunnel diodes. Suitable rectifier devices would be any device that conduct appreciatable current in one bias direction. Any device which have rectifier qualities as described above are within the scope of this invention.

The present invention uses semiconductor material (i.e. n-type and p-type material) for electron input and output channels instead of traditional higher conductive metallic material. Semiconductor material was chosen to reduce interference between electron channels and antennae, especially in highly packed antennae structures as discussed above.

Since each antenna gathers electromagnetic waves at a frequency consistent with its size and shape, and the diode (i.e., the rectifier structure) rectifies that energy into a D.C. current. As in both gap and gapless rectenna embodiments of the present invention, each rectenna element can be any size and any shape, and can be provided by any antenna type. A rectenna array can be made out of many different rectenna elements. The present invention is not limited to a dipole rectenna design, nor to the full-wave rectifying rectenna described above. According to another aspect of the present invention, an NBD capable of rectifying a small-amplitude, high frequency signal is provided, which is suitable for use in conjunction with the energy conversion device described above. This NBD is a "forced depletion" natural breakdown device, as explained below, according to one embodiment of the present invention.

The present invention referred a p-type or n-type region as fully depleted when the whole region is depleted of its respective majority carriers. This region may include different materials in any forms, shapes, dimensions, conductivities or concentrations.

The present invention referred a p-type or n-type region as fully depleted when the whole region is depleted of its respective majority carriers. This region may include different materials in any forms, shapes, dimensions, conductivities or concentrations. The doping level and other parameters may be varied independently to achieve the desired results. Although the examples and drawing shown herein for NBDs shown regions of homogeneous dopant concentrations, such regions are only provided for illustration purpose only. The present invention is equally applicable in devices where the dopant concentrations are non-homogeneous.

According to one embodiment of the present invention, a NBD type diode includes a semiconductor (say, p-type region) that has a width $w_p$ that is less than or equal to the depletion width $x_p$ of a conventional abrupt pn-junction without an externally imposed voltage. That is:

$$w_p \le x_p = \sqrt{\frac{2\varepsilon_s N_D \phi_i}{qN_A(N_A + N_D)}}$$

where $\epsilon_s$ the electrical permittivity of silicon, q is the charge of an electron, $\phi_i$ is the "built in" potential of the pn junction, $N_A$ and $N_D$ are the doping concentrations of p-region 101 and n region 102, respectively. As mentioned above, when $w_p = x_p$ ($w_n = x_n$), the region is referred to as a non-forced depleted region, and when $w_p \leqq x_p$ ($w_n \leqq x_n$), the region is referred to as a forced depleted region FIG. 3 is a schematic representation of NBD 300, according to one embodiment of the present invention. As shown in FIG. 3, NED 300 includes p-region 301 and n-region 302, with p-region 301 having a width $w_p$, which is less than or equal to the depletion width $x_p$ of a corresponding depletion width in the p-region side of a conventional pn junction. (A semiconductor region having a depletion width that is less than the depletion width for the corresponding semicondcutor type in a conventional pn junction is referred herein as having a "forced depletion" width). In contrast, the width of n-region 302 may be smaller than, greater than or equal to the conventional depletion region $x_n$ for the n region of a conventional pn junction diode of comparable doping concentrations. One embodiment of the present invention is a forced depletion condition on p-region 301, and n-region 302 having a width greater than $x_n$. Also shown are contact regions 303 and 304 which are contacts to allow NED 300 to be connected to an electronic circuit. The doping concentrations in p region 301 and n-region 302 are sufficiently high such that contacts 303 and 304 are ohmic contacts. Contact region 303 and 304 may be formed, for example, by depositing a conventional interconnect conductor, such as aluminum or copper, using conventional chemical vapor deposition techniques, or other means known to those skilled in the art. P region 301 and n region 302 may be formed in a conventional silicon substrate using ion implantation, or other means known to those skilled in the art.

Width $w_p$ of an NBD 300 may be calculated based upon the doping concentration. The predetermined width $w_p$ for NBD 300 may be calculated using the following steps:

(1) First choose doping concentrations for a p-region and an n-region of a conventional PN junction diode such that, under the zero applied bias voltage, the p-region has a depletion width $X_p$ between point 4 and point 3 and the n-region has a depletion width $X_n$ between point 3 and point 2, as shown in FIG. 3. These dimensions create a built-in voltage $V_D$ volts in the conventional pn junction diode. In an NBD, the built-in voltage $V_{FD}$ is less than $V_D$. Voltage $V_{th}$ is the threshold voltage for the conventional pn junction diode. The Fermi level of the NBD at zero applied bias voltage is shifted towards the Fermi level of the intrinsic semiconductor and away from the equilibrium Fermi level of a conventional pn junction diode.

(2) Select a voltage $V_s$, which is the maximum forward bias voltage that can be applied on NBD 300 before the region that is fully depleted at zero applied bias voltage ceases to be fully depleted. A number of desired features (e.g., constant tunneling current at low forward bias voltage, charge storage, voltage range of tunneling) may be achieved by the NBD between zero applied bias voltage and voltage $V_s$, depending on the application of the NBD. When the applied bias voltage is increased from zero towards voltage $V_s$, the Fermi level of the NBD is decreased towards the Fermi level of the conventional pn junction diode. However, if the applied bias voltage is decreased in this range, the Fermi level maintains a constant level, so that a charge is accumulated in the n-type region as the applied voltage decreases from $V_s$ to zero.

As the value of voltage $V_s$ is between zero and the conventional pn junction diode built-in voltage $V_D$, the voltage across the pn-junction is given by $V_x=V_D-V_S$. In one embodiment of the present invention, the value of voltage $V_S$ is selected to be close to the built-in voltage $V_D(V_S \sim V_D)$. The width of the fully depleted depletion region required to achieve this condition is very thin. In another embodiment of the present invention, the value of $V_s$ is not selected to be close to $V_D$. According to one embodiment of the present invention, the value of $V_s$ can be tuned or selected to accommodate an active voltage range for the NBD operation. The depletion width of NBD 300 remains unchanged as long as the applied bias voltage is less than $V_S$. As explained above, when an applied bias voltage on an NBD is between zero and $V_s$, a charge is accumulated. An NBD with a smaller $V_S$ stores less charge than an NBD which has a larger $V_S$.

(3) Calculate the depletion width $w_p$ of p-region 301 such that, when voltage $V_s$ is imposed on 303 toward p-region 301, the whole p-region 301 remains depleted. Assuming an abrupt junction approximation, the width $w_p$ may be calculated using the following equation:

$$x_p = \left[\frac{\frac{kT}{q}\ln\left[\frac{N_D N_A}{n_i^2}\right] - V_S}{\frac{e}{2\varepsilon_S}\left(\frac{N_A^2 + N_A N_D}{N_D}\right)}\right]^{\frac{1}{2}}$$

There are other ways to calculate $w_p$ as known by those skilled in the art. The built-in voltage $V_{FD}$ of the NBD 300 equals to—$(V_D-V_S)$ volts. If $w_p=x_p$, $V_s$ is zero volts.

Note that the width $w_p$ is calculated above using an abrupt junction approximation. Other suitable methods may also be used. The width $w_p$ may be calculated using different junction approximations, depending on the application. As explained above, the condition $w_p<x_p$ is referred to as a "forced depletion condition" and, under such a condition, p-region 301 is referred to as a "forced depletion region", according to one embodiment of the present invention. When p-region 301 is in a forced depletion condition, the value of $V_S$ is not equal to zero. The condition $w_p=x_p$, is referred to as a "non-forced depletion condition" and, under such a condition, p-region 301 will be referred to as a "non-forced depletion region", according to another embodiment of the present invention.

When p-region 301 is in non-forced depletion condition, the value of $V_S$ is equal to zero. Once $w_p$ is determined, an NBD 300 with the p-region 301 fully depleted between contact region 303 and n-region 302 may be created with different width of n-region 302. $W_n$ is the depletion region width of n-region 302 on NBD 300. The width of n-region 302 may range from $w_n$ to larger than $x_n$. The difference in the width of n-region 302 creates variations for the NBD 300. NBDs can be created having a width for n-region 302 greater than $x_n$. When the external voltages applied to contacts 303 and 304 is zero (zero applied voltage bias or without bias), p-region 301 of NBD 300 is fully depleted. One embodiment of the invention provides a forced depletion condition on p-region 301 with the $w_P$ is less than $x_p$ and the width of n-region 302 being a value between $w_n$ to larger than $x_n$. One embodiment of the invention is a non-forced depletion condition in which p-region 301 with a $w_p$ equal to $x_p$ and the width of n-region 302 may range from $w_n$ to larger than $x_n$.

When the applied bias voltage is less than zero volts, even by a small amount, the accumulated charge is relaxed. Thus, the NBD is conducting under a reversed bias condition.

Alternatively, the forced or non-forced depletion region dimensions can be obtained by starting with the dimensions of a conventional pn-junction, and adjusting the dopant concentrations of the p-region and n-region such that the width of one of the region ("first region") is exactly equal to its depletion region (non-forced depletion condition), if the regions form a conventional pn-junction, or further increasing the concentration of the other region, such that the width of the first region is now less than its expected depletion width, calculated as if the regions form a conventional pn-junction.

Figure 6:
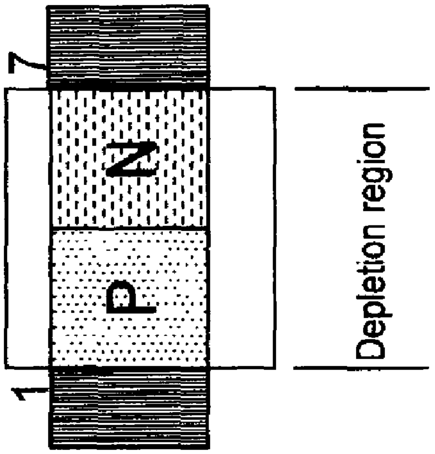
FIG. 6(*a*) is a schematic representation of a natural breakdown device (NBD) 600, having an N-type region that is fully depleted at zero bias voltage, according to one embodiment of the present invention.
Figure 6:
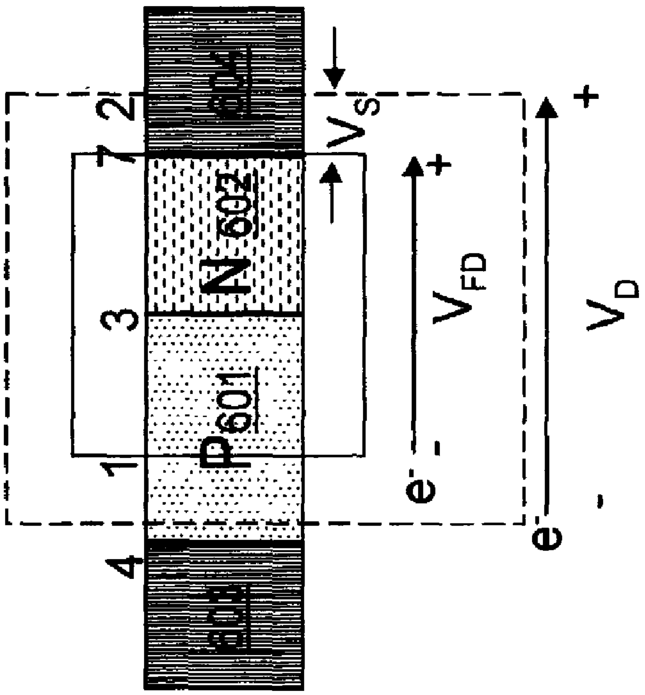

In another embodiment of the present invention, shown in FIG. 6, n-region 602 may also be put under a forced depletion condition without a forced depletion or non-force depletion in p-region 601, NBD 600 variations. An NBD can have more than one fully depleted region. The differences in the width of p-region 601 create variations for NBD 600. One embodiment of the invention provides a non-forced depletion n-region 602 (i.e., a $w_n$ that is equal to $x_n$) and a width of p-region 301 between $w_p$ to larger than $x_p$. The differences in the width of p-region 601 create variations for this embodiment. Another embodiment of the invention provides a forced depletion condition on n-region 602 with the $w_n$ is smaller than $X_n$ and the width of p-region 301 may range from $w_p$ to larger than $x_p$, according to this embodiment. The differences in the width of p-region 601 create variations for this embodiment. These variations of NBD are natural breakdown diodes. An NBD can have more than one fully depleted region. Each of these regions can be either a forced depletion region or a non-forced depletion region.

An NBD has one of the p-region or n-region fully depleted under zero biasing. NBD 300 has p-region 301 in a forced depletion condition and an n-region 302 with its width larger than $x_n$. The operations of NBD 300 are explained with respect to an external applied bias voltage under following conditions:

a) When a zero forward bias voltage is applied on NBD (i.e., at zero bias), the input voltage is $V_{IN}$, (i.e., $V_{IN}=0$).
b) When a forward bias voltage is applied on NBD 300 between 0 and $V_s$ (i.e., $0<V_{IN}<=V_s$).
c) When a forward bias voltage applied on NBD 300 is between $V_s$ and $V_{th}$ (i.e., $V_s<V_{IN}<V_{th}$).
d) When a forward bias voltage applied on NBD 300 is larger than $V_{th}$ (i.e., $V_{IN}>V_{th}$).
e) When a reverse bias voltage $V_{IN}$ is applied on NBD 300.

Accordingly, (a) When $V_{IN}=0$, an electric field (referred to as the "secondary electric field") with a voltage difference of $V_s$ is created along the edge of the depletion region in n-region 302. No current flows in the device. The voltage difference between the depletion region electric field and the built-in potential is $V_s$.

(b) When $V_s$ is selected to be not close to $V_D$, $0<V_{IN}<=V_s$ and $V_{IN}$ is applied at contact 303 on NBD 300, the depletion width in p-region 301 remains the entire width of p-region 301 because $V_{IN}$ is smaller than the voltage potential across the secondary electric field in n-region 302. As $V_{IN}$ increases, the Fermi level between the depletion region and the equilibrium Fermi level between the p-region 301 and n-region 302 decreases. As the applied bias voltage $V_{IN}$ increases, the secondary electric field strength decreases in n-region 302. Once $V_{IN}$ reaches $V_s$, the secondary electric field in n-region 302 becomes zero. NBD 300 responds to a signal change faster than a conventional pn junction, so that NBD 300 is suitable for rectifying high speed signals. This fast response time characteristic is present in all NBDs. A device that utilizes NBD concepts will have a faster response time than the same device not utilizing NBD concepts.

When $V_s$ is selected to be close to $V_D$, for an applied bis voltage $V_{IN}$ less than $V_s$ (i.e., $0<V_{IN}<=V_s$), a constant forward current flows in NBD 300 due to tunneling through the sufficiently thin depletion region. The depletion width in p-region 301 remains the entire width of p-region 301.

(c) When the applied bias voltage $V_{IN}$ is between $V_s$ and the threshold voltage (i.e., $V_S<V_{IN}<$Vth), the depletion widths in both p-region 301 and n-region 302 reduce. The voltage drop across the depletion regions reduces also. In this regime, a small forward leakage current proportional to $V_{IN}$ flows in NBD 300. As $V_{IN}$ becomes very close to $V_{th}$, the depletion width in NBD 300 becomes significantly small to allow a significant current to flow.

(d) When the applied voltage $V_{IN}$ exceeds the threshold voltage (i.e., $V_{IN}>=V_{th}$), NBD 300 conducts current.

(e) When a reverse bias voltage $V_{IN}$ is applied to NBD 300, the depletion width remains the same. As the reverse bias voltage increases the reverse current increases substantially linearly based upon the resistance between contact 303 and p-region 301 and the resistance between contact 304 and n-region 302.

(f) When reversed biased, NBD 300 operates as a majority carrier device (electrons being injected in to the n-region) as apposed to a minority carrier device when forward biased. The switching times of majority carrier device are typically faster than switching times of minority carrier device.

Figure 4:
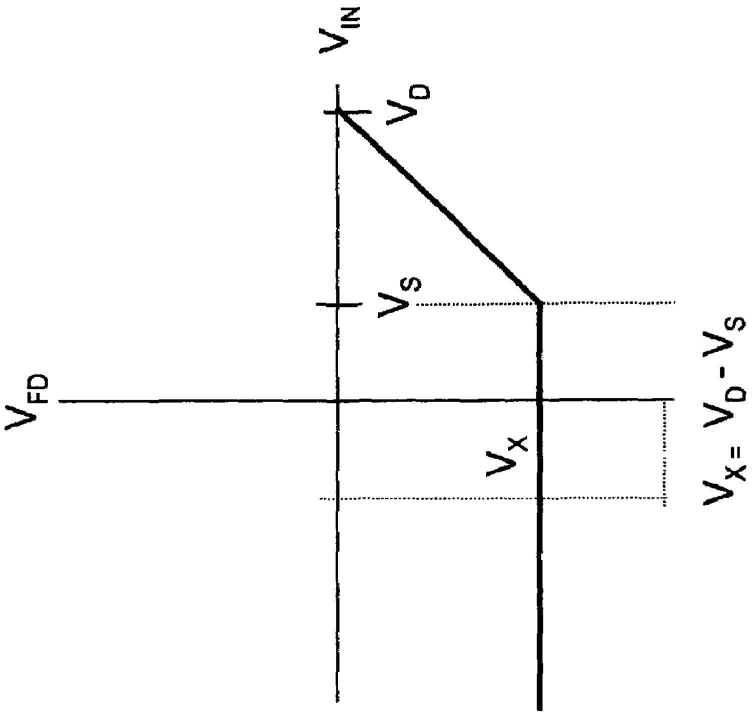
FIG. 4 shows the relationship between the built-in voltage $V_{FD}$ and bias voltage $V_{IN}$ across NBD 300 during operation.
Figure 5:
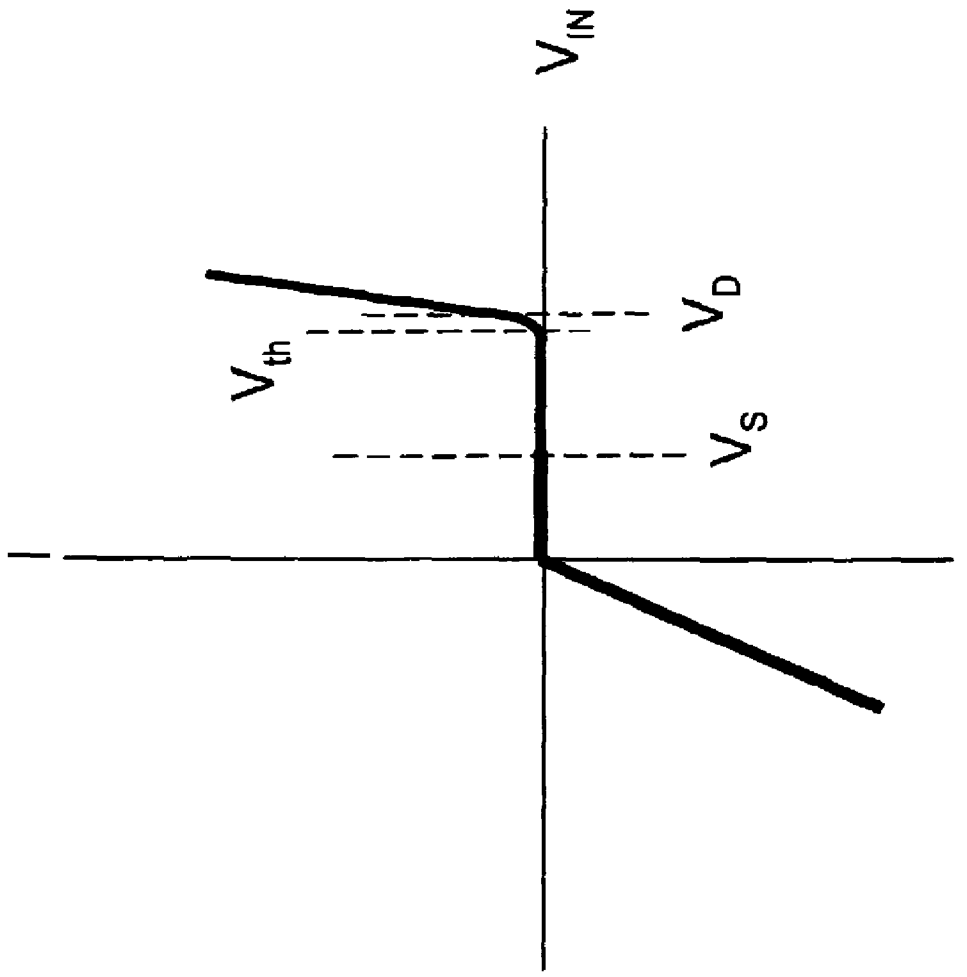
FIG. 5 shows the current-voltage (IV) characteristics of NBD 300 when the value of voltage $V_s$ is not close to the threshold voltage $V_{th}$ of NBD 300.
Figure 24A:
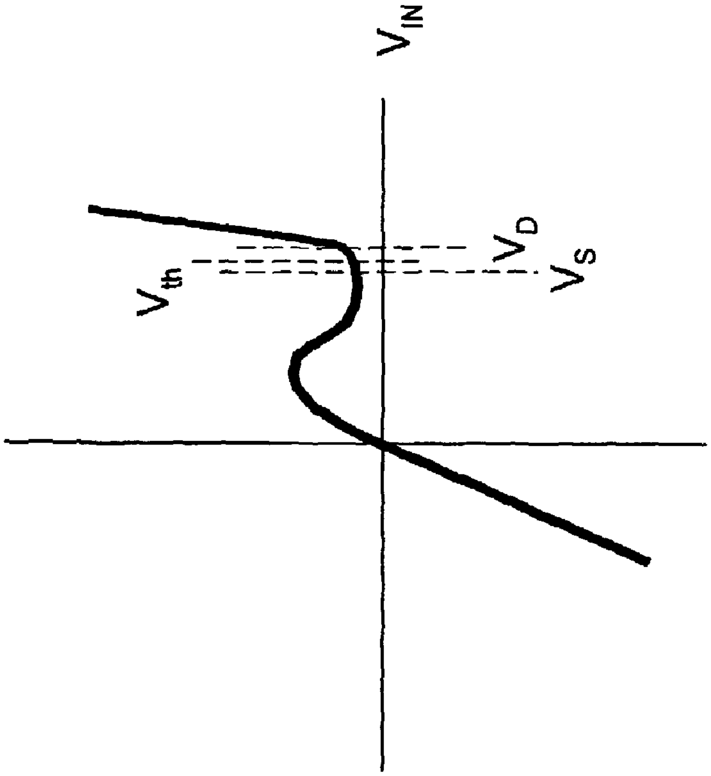
FIG. 24 shows the current-voltage (IV) characteristics of NBD 300 when voltage $V_s$ is close to threshold voltage $V_{th}$.
Figure 24B:
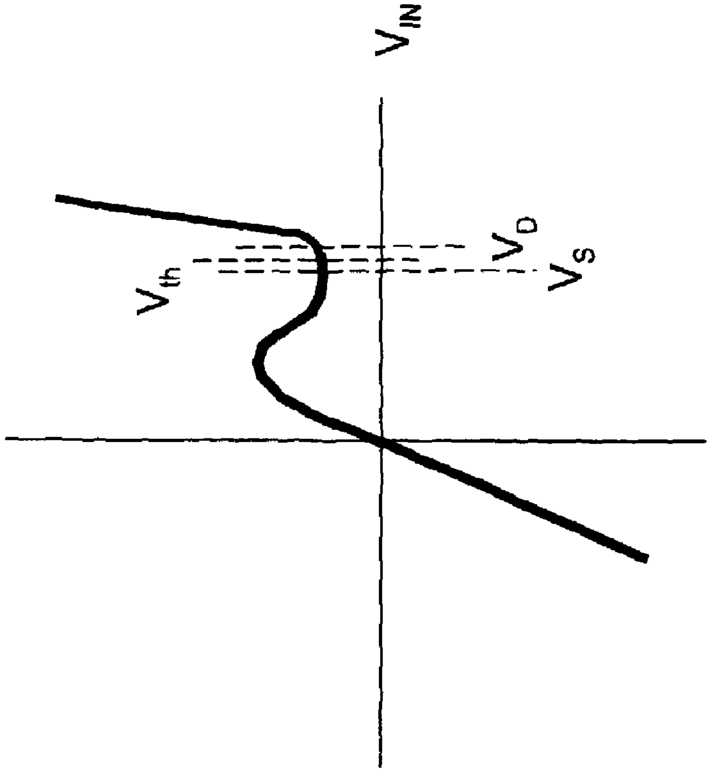

FIG. 5 is a plot of the current versus voltage (IV) characteristics of NBD 300, when $V_s$ is selected not to be close to $V_D$. NBD 300 can conduct appreciable reverse current when input voltage is negative and conduct forward current when input voltage is larger than $V_{th}$. NBD 300 conducts a negligible leakage current when the bias voltage is between 0 and $V_{th}$. When a forward bias voltage between 0 and $V_s$ is applied to an NBD, the depletion region width does not change as long as the Fermi level of the device is greater than the depletion region Fermi potential. This behavior is illustrated by FIG. 4 which shows the relationship between NBD 300 depletion region voltage $V_{FD}$ and the input voltage $V_{IN}$, where the behavior of the depletion width is also shown. FIG. 24 is a plot of the current versus voltage (IV) characteristics of NBD 300, when $V_S$ is selected to be very close to $V_D$, where a constant forward current due to tunneling is shown for an applied bias voltage between 0 volts and $V_s$.

In one embodiment the width of NBD 300 p-region for creating a constant current is calculated by the following:

1) Using the IV curve of a conventional diode utilizing the same materials and doping concentrations for NBD device, find forward bias voltage that matches desired current on curve. The bias voltage needs to be less than $V_{th}$. This bias voltage will be the $V_s$ value.
2) Determine width of depletion band of p-region in conventional diode when conventional diode is biased at $V_s$ determined in step 1). This can be done through calculation or simulation of device as known by those skilled in the art. This width is $W_P$.
3) Create an NBD with a p-region of width $W_p$ as determined in step 2) using the same material and doping concentration of conventional diode used in step 1).

An NBD device behaves asymmetrically for an increasing applied bias voltage between 0 volts and voltage Vs and a decreasing applied bias voltage over the same voltage range. As the applied bias voltage increases, the Fermi level of the device decreases, so that the secondary electric field decreases. However, when the applied bias voltage decreases over the same range, a third electric field appears at the secondary electric field edge in the n-region 302 neutral region, which continues to increase without causing a change in the Fermi level. If the bias voltage is again increased, this third electric field decreases. Once the applied bias voltage becomes negative, the charge in the third electric field is released, thereby causing a reverse current surge. The maximum voltage across the third electric field is $V_s$. Therefore, applying a negative bias voltage after applying a positive bias voltage on NBD 300 would result in a reverse current.

Another embodiment of the present invention has a forced depletion condition on p-region 301 and an n-region 302 with its width less than $x_n$ where the depletion band width does not completely cover n-region 302. The behavior of this device is the same as NBD 300 described above. For the situation when a forced depletion condition is created, the depletion width of n-region 302 covers the whole n-region 302 between contact 304 and complete depleted p-region 301, ("NBD 310"): The behavior of NBD 310 under condition (a) of $V_{IN}=0$ is the same as described above. The behavior of NBD 300 under condition (b) when $0<V_{IN}<=V_S$, status is the same as described above until the n-region 302 becomes fully depleted. Once n-region 302 is fully depleted, NBD 300 reaches condition (c) prior to $V_{IN}=V_s$. The behavior of NBD 300 under condition (c) is the same as described above.

When a NBD 300 is connected in series to a current source (i.e. a signal from an antenna or sensor), a voltage appears across NBD 300. Since NBD 300 conducts current at reverse biased voltage, a negative voltage potential appears when a current source imposes a reverse bias current.

Thus, NBD 300 can provide a small positive current when a positive bias voltage $V_{IN}$ less than $V_s$ is applied (i.e., $0<V_{IN}<=V_s$) is applied at contact region 303. NBD 300 can also rectify negative input signals (i.e., $V_{IN}<0$). NBD 300, with the capability of storing charge between $0<V_{IN}<=V_s$, and conducting a reverse current at reverse bias, can rectify very high frequency signals, within the regime from $V_s$ to $-V_s$ and negative voltage signals.

Another embodiment of the present invention provides a forced depletion p-region 301 and a forced depletion n-region 302 (i.e., having a width less than $x_n$). The behavior of NBD is the same as NBD 300 described above.

Another embodiment according to the present invention has a non-forced depletion width (i.e., $w_p=x_p$ or $w_n=x_n$). In this configuration, the resulting NBD is conductive at reverse bias. A non-forced NBD has the same reverse bias characteristics of an NBD 300. However, when a forward bias voltage is applied on a non-forced NBD, its current and voltage characteristics are the same as those of a conventional pn junction diode.

To summarize, an NBD of the present invention allows a conductive current flow when a reverse bias voltage applied. If an NBD and a current source are connected in series, the output voltage appears across the NBD. By selecting a value of $V_s$ at forward bias, NBD may be provided desirable features such as charge storage and constant current. If the applied bias voltage exceeds the threshold voltage, the NBD provides a conductive current. NBD 300 stores charge by a decreasing applied bias voltage between 0 volts and $V_s$; the stored charge is released when applied bias voltage becomes negative. Thus, an NBD can full wave rectify even a small sinusoidal signal, thus is suitable for applications such as solar energy generation. The application of the NBD invention to conventional PN junction diodes created two new active bias voltage ranges, namely the reverse bias voltage and forward bias between zero and Vs volts. These two new active regions enable NBD modified PN junction diodes to have three active regions to be utilized for applications.

An NBD does not have a breakdown voltage. As one of the regions of a pn junction is fully depleted, no leakage current is observed even under a reverse bias condition. The built-in electric field provides high conductivity at reverse bias by zeroing the distance for electrons and holes to travel across the pn-junction to the opposite region. A reverse current flows when the applied bias voltage $V_{IN}$ is negative (i.e., $0>V_{IN}$). Constant current or charge storage at forward bias can be provided by a non-zero $V_s$ value, depending on the application.

Figure 23:
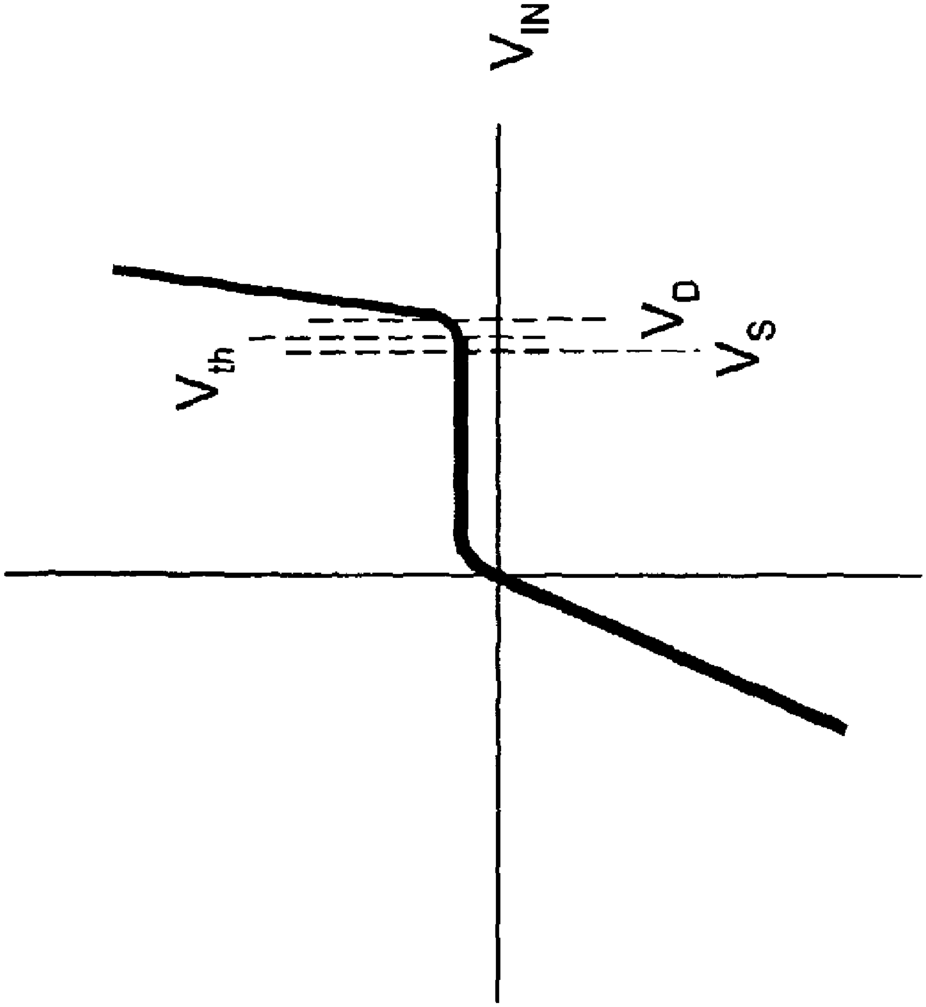
FIG. 23 shows the current-voltage (IV) characteristics of NBD 300 when contact resistance is very low.

FIG. 23 shows the IV curve of NBD 300 when contact resistance is very low, according to one embodiment of present invention. In this embodiment, the IV curve is very close to the ideal diode IV curve. Because the value of $V_s$ is not equal to zero, the NBD 300 will have charge stored when forward bias decreasing toward zero volts. This charge will be released when the NBD 300 is reverse-biased and creates a reverse current surge. The NBD 300 may be considered as an ideal diode with reverse current surge capability. In FIG. 23, when $V_S=0$, the IV curve is the same as the IV curve of non-forced NBD 300 with very low contact resistance, according to one embodiment of present invention. The non-forced NBD 300 may be considered as an ideal diode with a breakdown voltage at the forward threshold voltage.

According to another embodiment of the present invention, as discussed above, FIG. 6(*a*) shows NBD 600 with n-type region 602 having a width $w_n$ that is less than $x_n$—the depletion width of a conventional pn junction diode:

$$w_n \le x_n = \sqrt{\frac{2\varepsilon_s N_A \phi_i}{qN_D(N_A + N_D)}}$$

A similar determination provides width $w_n$ for NBD 600. The operation of a forced depletion condition with n-region 602 with its depletion band width $w_n<x_n$ and p-region 601 larger or equal to $x_p$ behaves as follows:

At (a) zero applied bias voltage, no current flows in the device. As $w_n<x_n$, an excess number of holes builds up along the edge of the depletion region in p-region 601, thereby creating a secondary electric field. The voltage potential across this secondary electric field is $V_s$.

At (b), when voltage $V_s$ is selected not to be close to $V_D$ and the applied bias voltage is between 0 volts and $V_s$ (i.e., $0<V_{IN}<=V_S$), n-region 602 remains fully depleted. As the applied bias voltage $V_{IN}$ increases, the secondary electric field decreases. Once $V_{IN}$ equals $V_s$, the secondary electric field in p-region 601 becomes zero. Thus, NBD 600 responds to a signal change faster than a conventional pn junction because the secondary electric field width is smaller than the depletion width of a conventional pn junction. Thus, NBD 600 is suitable for rectifying high speed signals.

When voltage $V_s$ is selected to be close to $V_D$ and for an applied bias voltage between 0 volts and $V_s$ (i.e., $0<V_{IN}<=V_s$), a constant forward current due to tunneling through the sufficiently thin depletion region. N-region 602 remains fully depleted the entire width of n-region 602.

(c) When the applied bias voltage is between $V_s$ and the threshold voltage (i.e., $V_S<V_{IN}<V_{th}$), the depletion widths in both p-region 601 and n-region 602 reduce. The current in the device is a small forward leakage current that is proportional to $V_{IN}$. The output voltage is $V_{IN}-V_D$. When $V_{IN}$ is very close to $V_{th}$, the depletion width on NBD 600 is significantly small for conductive current to flow.

(d) When the applied bias voltage exceeds the threshold voltage (i.e., $V_{IN}>=V_{th}$), NBD 600 conducts current.

(e) When a reverse bias voltage $V_{IN}$ is applied to NBD 600, the depletion width remains the same. As the reverse bias voltage increases the reverse current also increases substantially linearly.

NBD 600 has the same current versus voltage characteristics as NBD 300. NBD 600 also stores charge under a forward-biased voltage between 0 and $V_s$ in the same way as NBD 300. Also, like the NBD 300, when NBD 600 is connected in series to a current source a voltage appears across NBD 300.

Another embodiment according to the present invention provides $w_n=x_n$ (i.e., the non-forced depletion condition). Non-forced NBD 600 has the same behavior as a non-forced NBD 300.

Figures 7A, 7B, 7C:
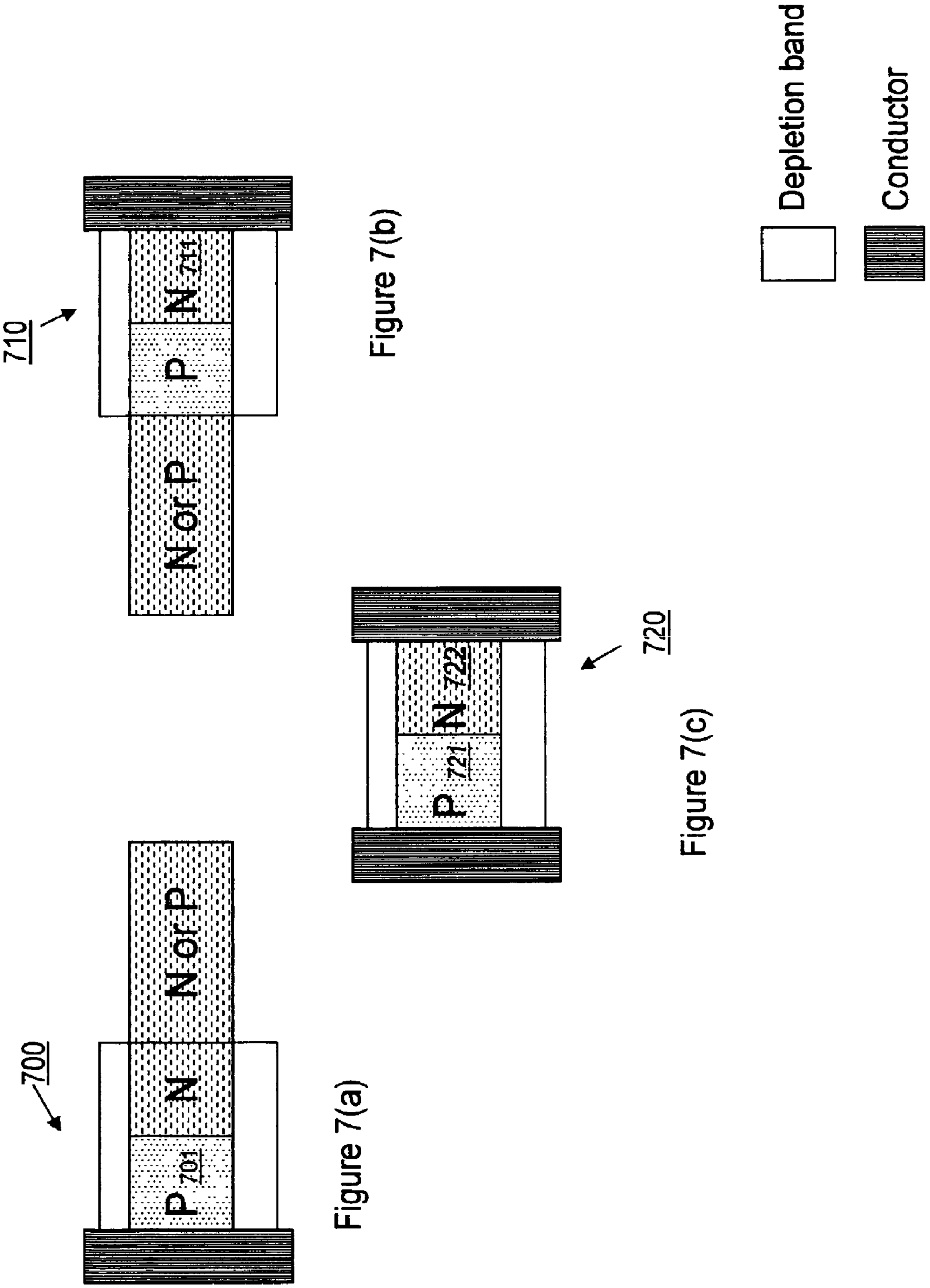
FIGS. 7(*a*) to 7(*c*) show NBD 700, NBD 710 and NBD 720, each including a depleted region (e.g., depletion regions 701, 711, 721 or 722), at zero applied voltage bias.
Figures 8A, 8B, 8C, 8D, 8E:
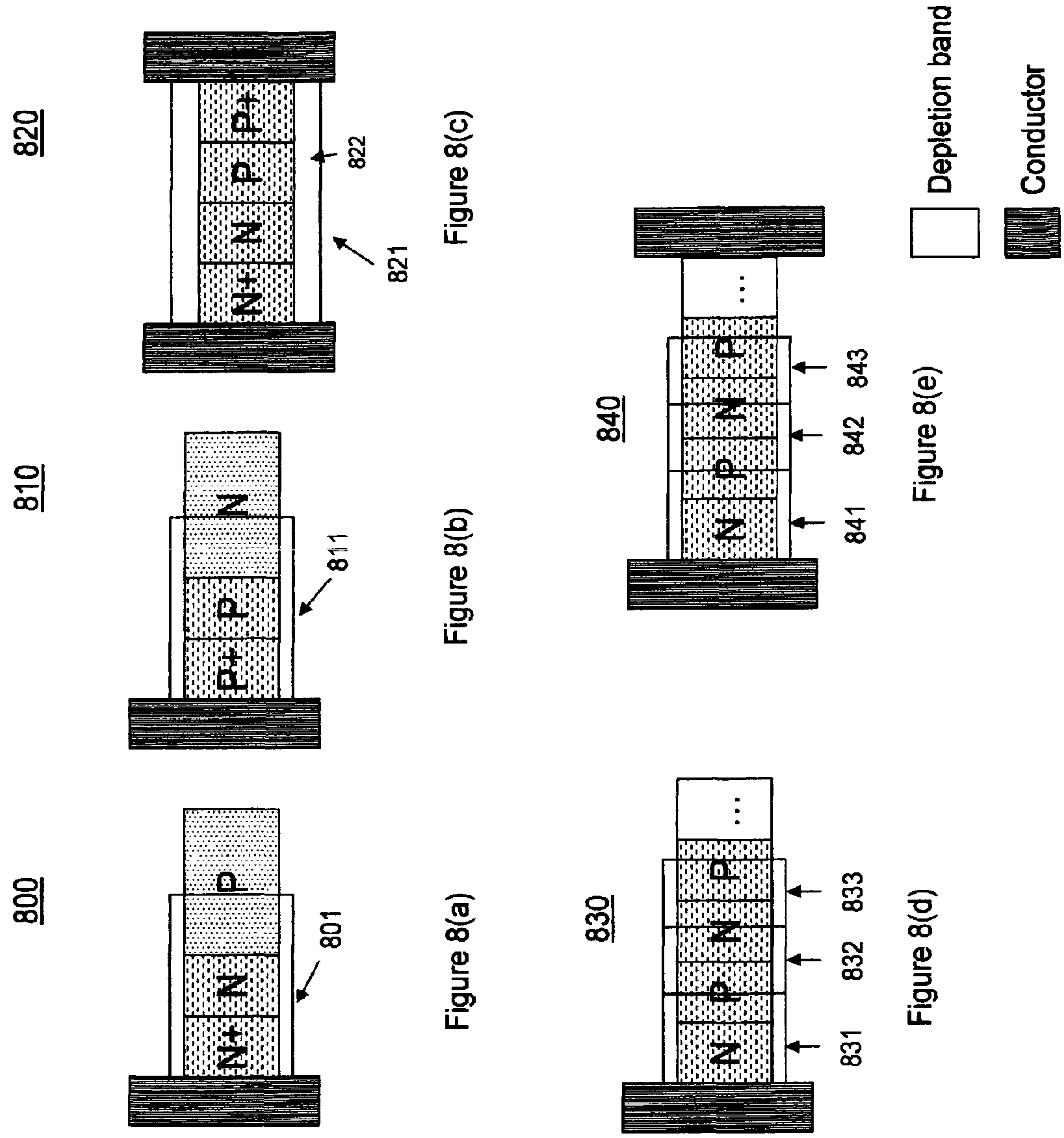
FIGS. 8(*a*) to 8(*f*) show NBD 800, NBD 810 and NBD 820 each including a forced depletion region (e.g., depletion region 801, 811, 821 and 822) having two or more doping concentrations at zero applied voltage bias. In particular, FIG. 8(*f*) shows multiple NBD 600s connected in series at zero bias.
Figure 8F:
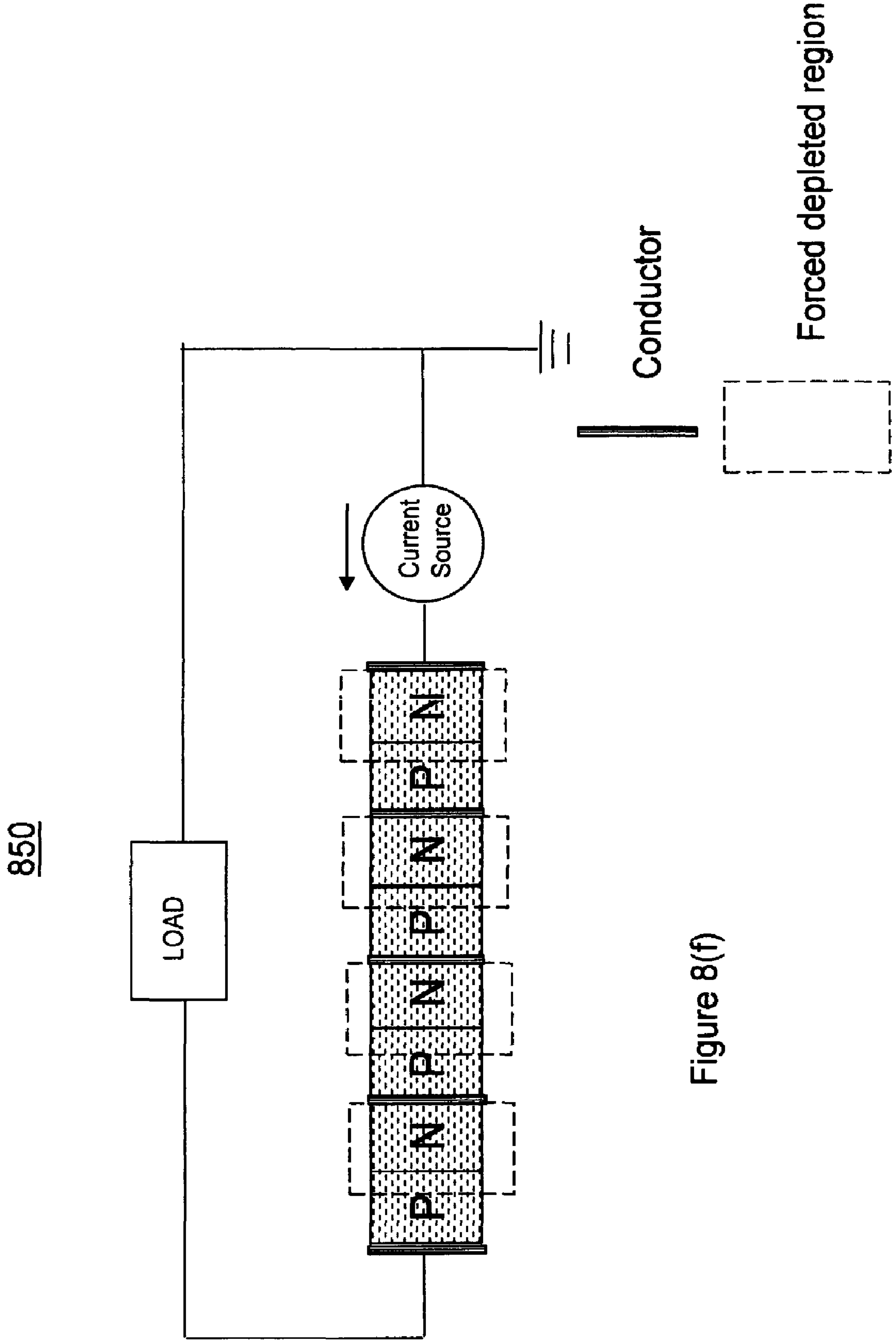

According to one embodiment of the present invention, FIG. 6(*b*) shows an NBD having two regions (p-region and n-region) which are both under forced depletion condition. According to other embodiments of the present invention, FIGS. 7(*a*), 7(*b*) and (*c*) show different NBD configurations, represented by NBD 700, NBD 710 and NBD 720, each including a region (e.g., 701, 711, 721 or 722) under the forced depletion condition. Also, when region 702 is p-type and region 712 is n-type, then NBD 700 and NBD 710 can be seen as NPN and PNP transistors respectively. FIGS. 8(*a*), 8(*b*), 8(*c*), 8(*d*) and 8(*e*) show different NBD configurations 800, 810, 820, 830 and 840 each including a region (e.g., 801, 811, 821, 822, 831, 832, 833, 841, 842, and 843) having two or more doping concentrations under forced depletion conditions. FIGS. 15(*a*) to 15(*d*), 16(*a*) and 16(*b*) show some of the embodiments of the NBD, according to the present invention.

Figures 17A, 17B, 17C, 17D, 17E, 17F:
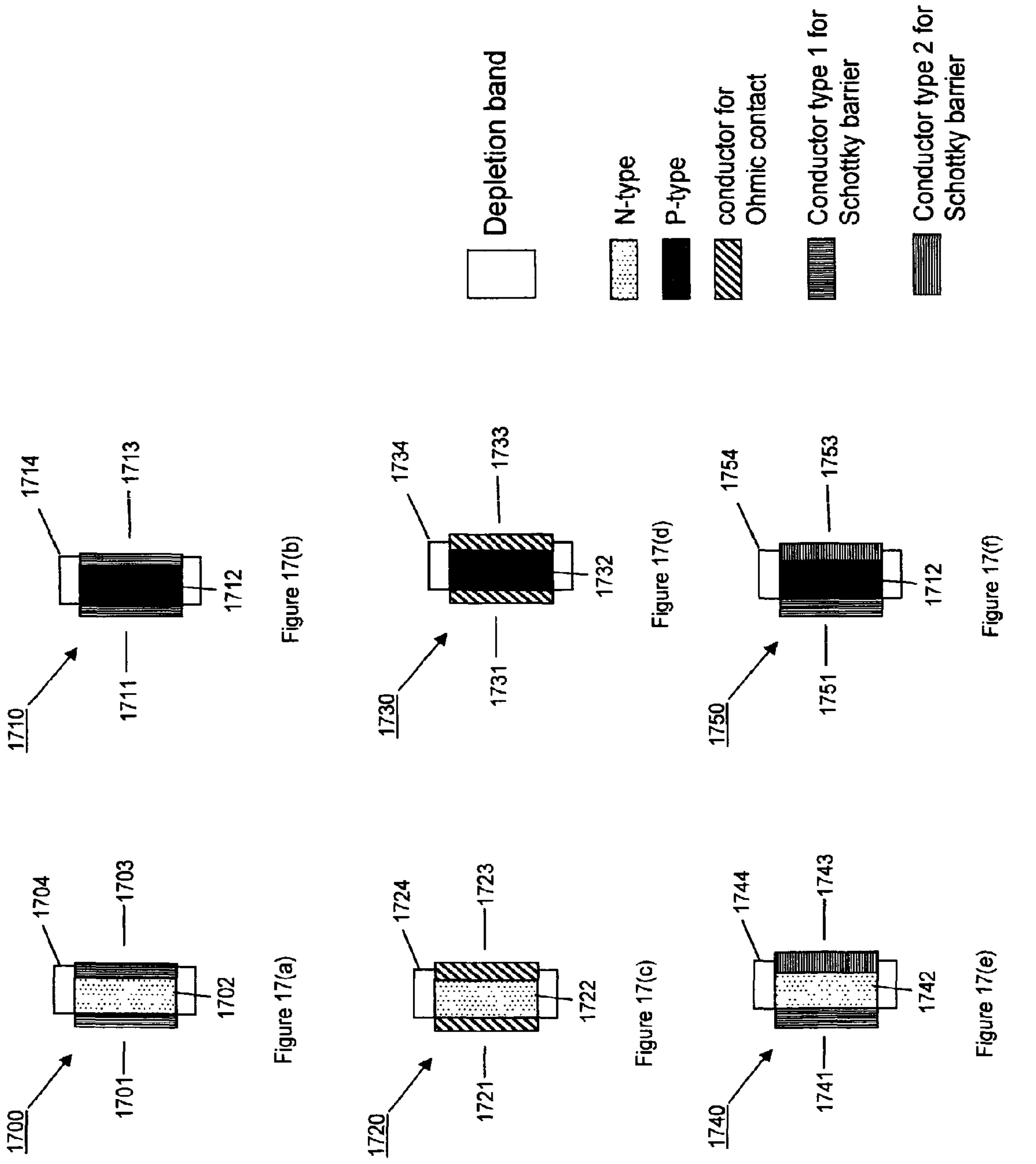
FIGS. 17(*a*) to 17(*f*) show schematic representations of various NBDs at zero applied voltages, according to one embodiment of the present invention.

FIGS. 17(*a*) to 17(*f*) show some NBDs at a zero applied bias voltage, each having a forced depletion p-region (or n-region) formed adjacent to a Schottky barrier or an ohmic contact. The Schottky barrier or ohmic contact imposes a fully depletion p-region or a fully depletion n-region. Each of these fully depleted region may be considered non-forced or forced depleted regions.

FIG. 18(*a*) shows NBD 1800 at a zero applied bias voltage, and conductors 1801 and 1803 which are contacts provided for connecting NBD 1800 to an electronic circuit. In NBD 1800, n-region 1802 is fully depleted under a forced depletion condition, having a width less than depletion width 1804. The doping concentration in n-region 1802 is sufficiently high such that the junction between conductor 1803 and n-region 1802 is an ohmic contact and conductor 1801 forms a Schottky barrier to n-region 1802. NBD 1800 under reverse bias voltage performs substantially in the manner described above for NBD 600, having the characteristics such as fast switching, conducting at a reverse bias, and a reverse voltage when connected with a current source in series. NBD 1800 under forward bias performs substantially the same as a conventional n-type Schottky diode under forward biased utilizing comparable materials. The forced depletion width described above for the pn junction configuration may be applied to determine the forced depletion width of a fully depleted p-region 1812 (or n-region 1802).

FIG. 18(*b*) shows NBD 1810 at a zero bias, and conductors 1811 and 1813, which are contacts providing for connecting NBD 1810 to an electronic circuit. P-region 1812 is fully depleted under a forced depletion condition, so that the width of p-region 1812 is less than depletion widths 1814. The doping concentration in p-region 1812 is sufficiently high, such that the junction between conductor 1813 and p-region 1812 is an ohmic contact, and conductor 1811 forms a Schottky barrier to p-region 1812. NBD 1810 when reverse biased performs substantially in the manner describe above for NBD 300, having characteristics such as fast switching, conducting at reverse bias, and a reverse voltage when connected with a current source in series. NBD 1810 under forward bias performs substantially the same as a conventional p-type Schottky diode under forward biased utilizing comparable materials.

To determine a forced depletion width for NBD 1800, (1) a depletion width $x_n$, built-in voltage $V_D$ and threshold voltage $V_{th}$ of a conventional Schottky diode are determined using an n-region doping concentration at a zero bias, (2) a forward-bias work voltage $V_s$ that is between zero and $V_{th}$ is selected that can be used with Schottky diode 1800, and (3) the depletion width $w_n$ of n-region 1802 is calculated such that, when a forward bias voltage $V_s$ is applied on NBD 1800, n-region 1802 remains depleted with a built-in voltage $V_{FD}$ that is equal to $-V_x$ ($V_x$ is given by $V_x=V_D-V_s$). Regions 1802 and 1812 include, respectively, multiple p-type and n-type sections of different doping concentrations. According to another embodiment of present invention, an NBD may also be formed using three semiconductor regions, one or more of which is fully depleted. For example, all three regions may be fully depleted. A transistor having at least one fully depleted semiconductor region is an NBD within the scope of the present invention, which may used, for example, in conjunction with the rectenna described above.

According to another embodiment of the present invention, FIG. 19(*c*) shows NPN bipolar device 2020 with no external voltages being applied. Device 2020 has n-type region 2026 fully depleted, p-type region 2025 sufficiently large to have a neutral region between depletion regions 2027 and 2028 and n-type region 2024 sufficiently large to have a neutral region between depletion region 2028 and contact 2023. The p-type region 2025 (neutral region) is sufficiently large to prevent overlap of minority diffusion from depletion regions 2027 and 2028. Device 2020 is considered a forced depleted device when n-type region 2026 is forced depleted and is considered non-forced depleted device when n-type region 2026 is non-forced depleted. Device 2020 is considered a conventional device when n-type region 2026 has a neutral region between contact 2021 and depletion region 2027.

Figure 28:
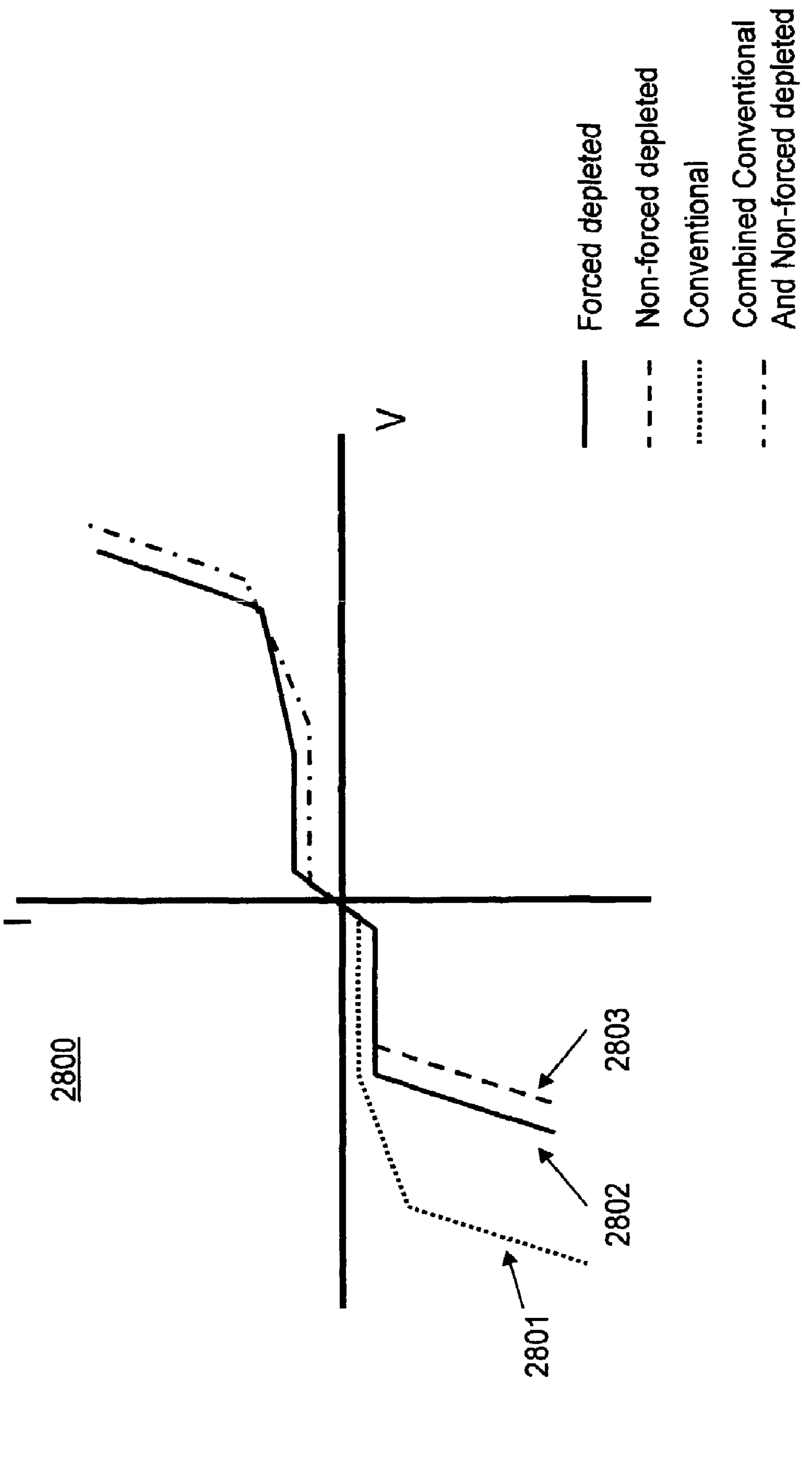
FIG. 28 shows the current-voltage (IV) characteristics of NBD 2020.

FIG. 28 shows IV curves 2801, 2802 and 2803 for a conventional device, a non-forced depleted device and a forced depleted device respectively. IV curves 2801, 2802 and 2803 are exaggerated and provided only for illustration purposes only. The bias voltage is with respect to fully depleted n-type region 2026 therefore forward biasing device 2020 would be to have contact 2023 at a positive voltage relative to contact 2021. When device 2020 is a conventional device, a forward bias decreases the depletion region 2027 width and depletion region 2028 width increases. From IV curve 2801, as the forward bias increases across conventional device 2020 current remains small and constant (i.e. leakage current) until depletion region 2027 conducts and depletion region 2028 width increases sufficiently so that its minority diffusion reaches depletion region 2027. As the forward bias is further increased across device 2020 (conventional), the current increases until depletion region 2028 reaches depletion region 2027 where current increases exponentially. TV curve 2801 is based on device 2020 being conventional and having n-type region 2024 and n-type region 2026 each having the same neutral region width. Therefore, when device 2020 is conventional, it has similar characteristics reverse biased as forward biased in that depletion region 2028 width decreases and depletion region 2027 width increases.

Comparing a non-forced depleted device IV curve 2803 to conventional device TV curve 2801, it can be seen that during forward biasing both devices behave similarly except during reverse biasing the non-forced depleted device has exponential increase in current at a smaller voltage magnitude then the conventional device. This behavior can be understood by the fact that a non-forced depleted region behaves the same as a conventional region when forward biased but conducts immediately when reverse biased, as explained above. Therefore when non-forced depleted device is reversed biased exponential increase of reverse current will occur as soon as depletion region 2028 start having exponential increase in current instead of when depletion regions 2027 and 2028 contact each other.

Comparing forced depleted device IV curve 2802 to conventional device IV curve 2801, it can be seen that there are differences in both forward biasing and reverse biasing. As explained above, a forced depleted region behaves differently during increasing forward biasing verses decreasing forward biasing. During increasing forward biasing between zero and $V_s$ depletion region 2027 width remains the same until, depletion region 2028 width increases and the n-type region 2026 Fermi level moves toward its non-forced Fermi level. During decreasing forward biasing between zero and VS depletion region 2027 width remains the same and depletion region 2028 width also remains the same. This is due to the potential voltage created across p-type region 2025 neutral region maintaining the same potential voltage between p-type region 2025 and n-type region 2024. After an increase or decrease forward bias cycle between zero and $V_s$, the threshold voltage for the n-type region 2026 or p-type region 2025 junction will be reduced by $V_s$ volts. Also after this forward bias cycle depletion region 2028 will be increased (i.e. the threshold voltage increased) by $V_s$ volts. It can be seen that a voltage of $V_s$ has been transferred from a threshold voltage in forced depleted region (i.e. n-type region 2026) to a threshold voltage in an adjacent semiconductor region (i.e. p-type region 2025).

IV curve 2802 shows the IV characteristics for forced depleted device 2020 after an increasing/decreasing forward biasing between zero and $V_s$. The reduced threshold voltage in forced depleted n-type region 2026 means during forward biasing current will flow across depletion region 2027 at a lower voltage than either the non-forced depleted device and conventional device. Also, during forward biasing, exponential current increase occurs at a lower voltage due to the increase width of depletion region 2028. At reverse bias the increased width of depletion region 2028 requires a larger negative bias before exponential current will occur.

A fully depleted region within a NBD of the present invention will obey the following rules:

1) If the fully depleted region is forced depleted, then at thermal equilibrium the Fermi level in the forced depleted region will adjust toward the intrinsic semiconductor Fermi level by the amount necessary to create a net zero current through the device.

2) A voltage difference in neutral regions adjacent to fully depleted regions is created before the fully depleted region's Fermi level is adjusted toward the intrinsic semiconductor Fermi level.

3) A fully depleted region's Fermi level will adjust toward its original level before voltage differences are created in neutral regions adjacent to the fully depleted region.

Based on the above rules characteristics for forced depleted regions within a NBD are as follows:

At thermal equilibrium prior to any bias voltage:

The forced depleted region's Fermi level is forced toward the semiconductor intrinsic level. The voltage associated to this energy shift is $V_s$.

All depletion regions within fully depleted regions will have reduced widths compared to non-fully depleted and conventional region of same material as fully depleted region.

During increasing forward bias between zero and $V_s$:

The forced depleted region's Fermi level moves toward its original Fermi level.

Depletion regions associated with the forced depleted region maintain there same widths.

During decreasing forward bias between zero and $V_s$:

If there are no adjacent neutral regions to the forced depleted region, then the forced depleted region's Fermi level moves toward intrinsic level.

If there are no depletion regions which can increase in width within adjacent neutral regions to the forced depleted region then charge will build up in adjacent neutral regions. The forced depleted region's Fermi level will stay the same. Depletion regions associated with the forced depleted region maintain there same widths.

Any depletion region which can increase in width within adjacent neutral regions to the forced depleted region will increase in width. Built-in potentials associated with the forced depleted region will be reduced making their threshold voltages lower. The forced depleted region's Fermi level stays the same. Depletion regions associated with the forced depleted region maintain their same widths.

During reverse bias:

If the device has only one depletion region, then the device will conduct at near zero bias (no threshold voltage), any charge storage due to decreasing forward biasing is immediately released, the forced depleted region's Fermi level moves toward its semiconductor intrinsic level until reaching the thermal equilibrium level. The depletion region in forced depleted region creates a negative potential voltage through device.

If the device has more than one depletion region, then the device will have a reverse threshold voltage (i.e. a breakdown voltage). Any charge stored stays until the device conducts a reverse current. The forced depleted region adds a negative potential voltage when the device is conducting reverse current.

Based on the above rules characteristics for non-forced depleted regions within a NBD are as follows:

Thermal equilibrium

The same as when utilizing a non-fully depleted region.

Forward bias increasing

The same as when utilizing a non-fully depleted region.

Forward bias decreasing

The same as when utilizing a non-fully depleted region.

Reverse bias

If the device has only one depletion region, then the device conducts at near zero bias (no threshold voltage). The depletion region in non-forced depleted region creates a negative voltage through device.

If the device has more than one depletion region, then the device has a reverse threshold voltage (breakdown voltage). The non-forced depleted region adds a negative voltage when the device is conducting a reverse current.

FIGS. 27.1 to 27.4 show a table of NBD structures with their expected characteristics. The first column on the left side of the table is the structure of the NBD as if the structure where laid out in linear manner. The terms used to indicate the structure are the following:

"Sch"—Contact-Semiconctor Schottky barrier

"Ohm"—Contact-Semiconductor Ohmic barrier,

"N non-F"—Non-forced depleted n-type region

"P non-F"—Non-forced depleted p-type region

"N Forced"—Forced depleted n-type region

"P Forced"—Forced depleted p-type region

"N"—n-type region with a neutral region

"P"—p-type region with a neutral region

The second column of the table indicates whether or not the fully depleted region has its Fermi level adjusted toward the semiconductor intrinsic level. A forced depleted region has its Fermi level adjusted (i.e. "Yes") while a non-forced depleted region does not (i.e. "No"). The third and forth columns define the characteristics that the structure has during increasing and decreasing forward biasing respectively. Terms used in these columns are the following:

"->Efn"—Indicates that the Fermi level of fully depleted region moves toward its original Fermi level prior to being fully depleted.

"->Efn"—Indicates that the Fermi level of fully depleted region moves towards the semiconductor intrinsic level.

The fifth column indicates whether or not the NBD structure conducts a reverse current at near zero reverse bias with a reverse potential across structure. The sixth column indicates whether or not the structure maintains the same bias voltage to conduct current (i.e. threshold voltage) after biasing the structure. A "No" means that after an increasing forward bias followed by a decreasing forward bias (a forward bias cycle) that one or more junctions have a different potential barrier then prior to the forward cycle.

According to another embodiment of the present invention, FIGS. 19(*a*) and 19(*b*) show NPN bipolar transistors 2000 and 2010 with no external voltages being applied. As shown in FIG. 19(*a*), NPN bipolar transistor 2000 has a fully depleted n-type region 2006 which may function either as an emitter or as a collector for NPN bipolar transistor 2000. FIG. 19(*b*) shows NPN 2010 having fully depleted n-type regions 2014 and 2016 as an emitter and a collector, respectively. Different transistor characteristics may be achieved using one or more different semiconductor regions that are under a forced or non-forced depletion condition. For example, depleted regions 2006, 2014 and 2016 in NPN transistors 2000 and 2010 may be put under forced or non-forced depletion conditions. Base P-type regions 2005 and 2015 may also be made fully depleted. PNP bipolar transistor structures may also be formed according to principles described for NPN transistors 2000 and 2010 above.

Figure 26:
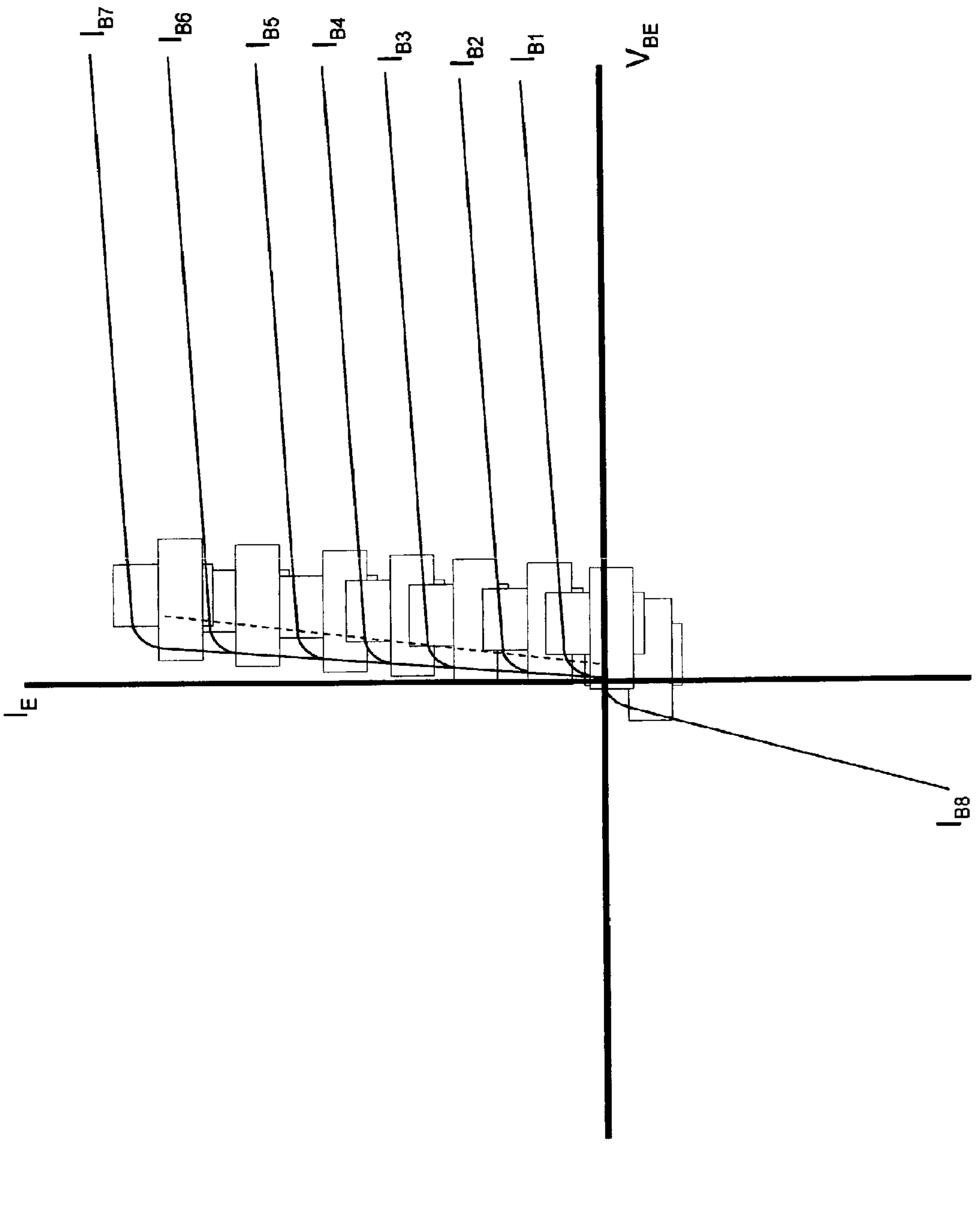
FIG. 26 shows the current-voltage (IV) characteristics of NBD 2000.

The behaviors of NPN and PNP transistors change when one or more of their semiconductor regions are completed depleted. Using NPN transistor 2000 configured in a common-emitter configuration (i.e. with emitter terminal 2003 grounded) as an example, when emitter region 2006 is fully depleted, a current flows from emitter region 2006 to base region 2005 (i.e. electrons flow from base region 2005 to emitter region 2006) when emitter region 2006 is reversed biased or zero biased relative to base region 2005. This current affects the cut-off mode operation of NPN transistor 2000. Depending on whether or not emitter region 2006 of NPN transistor 2000 is in a forced depleted condition, determines base-to-emitter voltage $V_{BE}$ is in a range that maintains emitter region 2006 fully depleted. FIG. 26 shows an example of the IV characteristics of NPN transistor 2000 when the emitter is forced depleted. The dashed line shows the IV characteristics of a conventional NPN transistor.

According to another embodiment of the present invention, four or more regions in different combinations of fully depleted or un-depleted (i.e., conventional) semiconductor regions may also be used to form NBDs. Further, whether or not a center semiconductor region may be fully depleted between two fully depleted adjacent semiconductor regions results in different NBDs. Therefore, all variations in an NBD with respect to the semiconductor material types, the numbers of fully depleted regions (whether or not in a forced-depletion condition), the numbers of un-depleted regions, the alignment or orientation of the semiconductor regions, the different doping concentrations are within the scope of the present invention. The forced and non-forced depletion conditions of the present invention can be applied to any device having one or more semiconductor regions that is not fully depleted to modify the behavior for such a device. This may also result in new devices.

It is known in the art that there are no contact materials that create a true p-type ohmic contact. Instead a p-type Ohmic contact may be emulated using a p-type Schottky contact with a sufficiently thin depletion region. The thin depletion region allows tunneling, as it is created using a highly doped p-type material. Using a highly doped p-type material may be undesirable or may not provide a low enough resistance. Another embodiment of the present invention creates a p-type Ohmic contact using an NBD structure which includes a contact, a forced depleted n-type region adjacent to the contact and a p-type region adjacent n-type region opposite the contact. As explained above, the built-in potentials between the forced depleted n-type region and the contact and the p-type region are reduced after an increasing and decreasing forward bias cycle if the p-type region has another depletion region within its neutral region. The forced depleted n-type region is sufficiently thin to allow tunneling between the contact and the p-type region. This p-type ohmic NBD structure may reduce the resistance between a p-type region and a contact in some circumstances. In another embodiment of the present invention a contact, a forced depleted p-type region adjacent to contact and a n-type region adjacent to n-type region opposite contact forms a n-type ohmic NBD structure.

A fully depleted region may be created using a p-type or an n-type material adjacent to an intrinsic material. In another embodiment of the present invention, an NBD uses a forced depleted region created by a p-type or an n-type semiconductor region adjacent to at least one intrinsic semiconductor region. In another embodiment of the present invention a NBD uses a non-forced depleted region created by a p-type or an n-type semiconductor region adjacent to at least one intrinsic semiconductor region.

In an NBD, when a p-type region is fully depleted at zero applied bias voltage, no drift current flows in it. Therefore, a thermally generated current carrying species of a non-fully depleted region, normally associated in a conventional pn junction diode with a leakage current does not occur in a fully depleted region. This is because an electric field forces any such electrons to move from the fully depleted p-region to the non-fully depleted region and any such holes to move from the non-fully depleted region to the fully depleted p-region, so that the NBD is conductive at zero bias. In some NBDs, such as a Schottky diode, the contacts to the devices can act as a p-type or n-type region.

FIG. 8(*f*) shows multiple NBD 600s connected in series in order to generate a voltage from a current source, thus supplying power to a load, according to application of the present invention. Therefore, the output voltage of multiple NBDs connected in series to generate a desired output voltage that is multiple times of a single NBD output voltage. NBDs may be connected in parallel to prevent an input current that is greater than the saturation current of any of the serially connected NBDs. By varying the number of NBDs and the manner of connection, variations of desired output voltages or currents may be achieved.

According to one of the embodiment of present invention, NBD 300 has characteristics as following: (1) low reverse current threshold voltage, (2) rectification of small signals (3) rectification of high frequency signals (4) conductivity at reverse-bias with appreciable amount of current and (5) reverse output voltage when connected in series with a current source. In addition, in a reverse bias mode, the conducting current of NBD 300 is significantly greater than the leakage current of a conventional diode prior to breakdown. Further, as the built-in voltage raises the output voltage level, NBD 300 indirectly raises the output power. New types of circuits for network switching, digital computing, signaling and waveform shaping (such as clipping and clamping) using NBDs are thus possible. Special diodes using P-type and N-type materials, including Step-Recovery (SRD), PIN and Zener diode types, may be created by modifying the depletion widths which may be determined, for example, by the steps described above. By having multiple p-type and n-type regions of different doping concentrations, other diode characteristics such as the saturation current, leakage current and input/output resistance can be created accordingly.

Figure 25A:
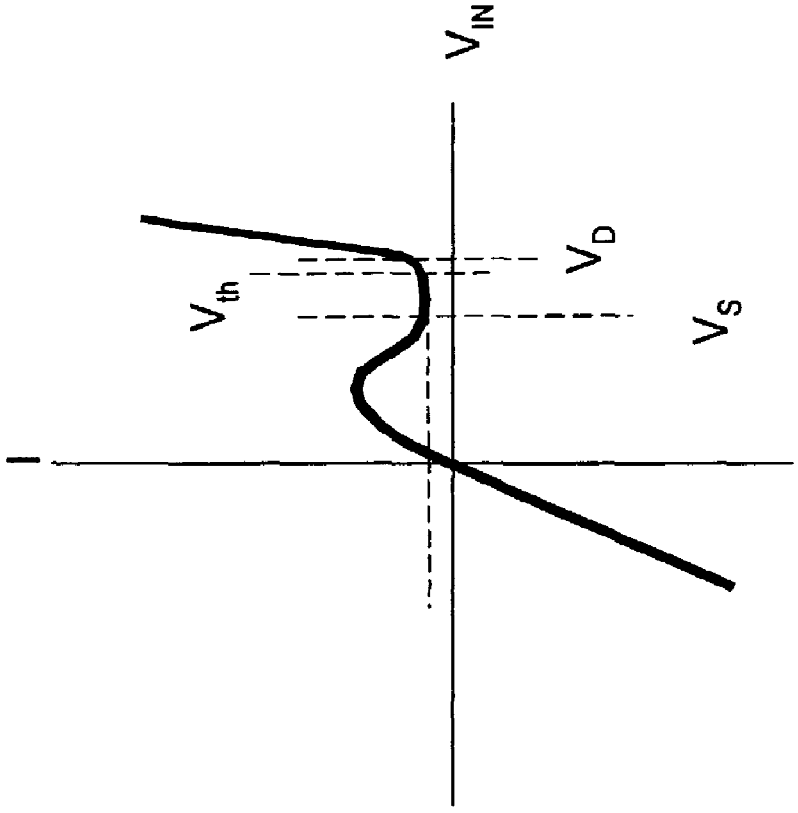
FIG. 25(*a*) shows the current-voltage (IV) characteristics of NBD 300 utilizing degenerate material when the value of $V_s$ is not close to threshold voltage $V_{th}$.
Figure 25B:
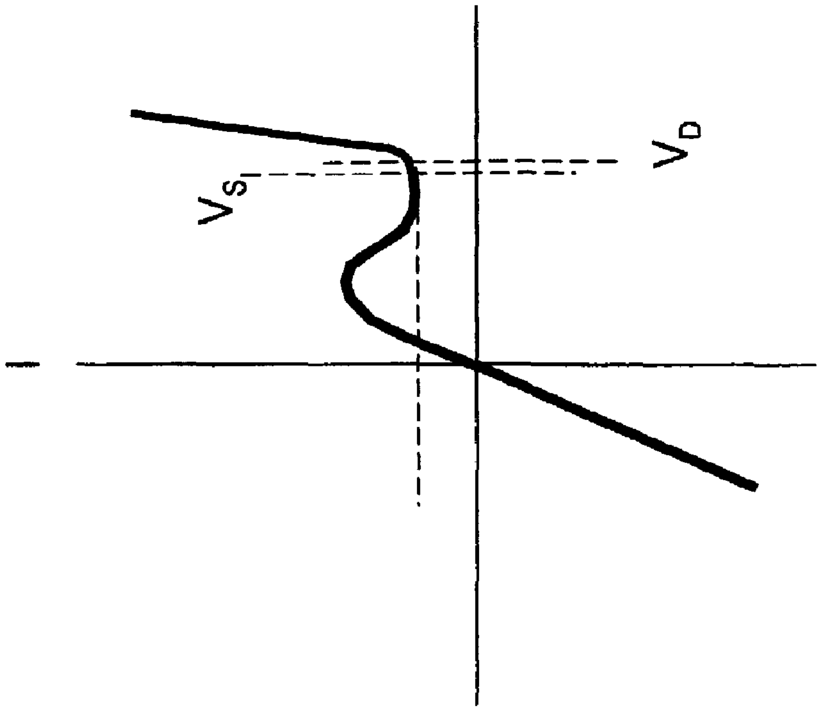

According to one embodiment of the present invention, different characteristics of an NBD may be achieved using degenerate materials. Devices using degenerate materials typically exhibit tunneling and negative resistance characteristics within voltage ranges that are less then $V_{th}$. An NBD with different values of $V_s$ can shift tunneling and negative resistance voltage ranges. FIG. 25(*a*) shows the current-voltage (IV) characteristics of NBD 300 fabricated using degenerate materials for one value of voltage $V_s$ which is not close to $V_{th}$. NBD 300 in this configuration shows a larger voltage range in which tunneling occurs and a smaller voltage range in which negative resistance voltage occurs, relative to a conventional pn junction diode utilizing the same degenerate materials. FIG. 25(*b*) shows the current-voltage (IV) characteristics of NBD 300 utilizing degenerate materials for another value of $V_s$ which is selected to be closer to the threshold voltage $V_{th}$. NBDs in this configuration have larger minimum forward currents and reduced negative resistance values than a conventional pn junction diode utilizing the same degenerate materials.

The above examples show that tunneling devices can be provided by NBDs, in accordance with the present invention. Such tunneling devices have desirable characteristics in voltage range, current range and resistance. In one embodiment of present invention, tunneling diodes with different peak voltage, peak currents, valley voltages, or valley currents are also possible. High frequency applications using NBD type tunnel diodes are possible. By varying and mixing different types of materials in NBD devices, such as using a combination of nondegenerate and degenerate materials, new devices or new features may be achieved for existing devices.

Furthermore, the device in accordance with the present teaching are essentially low voltage devices or devices which can operate with a high signal-to-noise ratio, which makes them well suited to uses as detectors in optical communication systems. Drawings and figures for the EM rectenna of the present invention are provided for explanations and do not represent the relationship of connecting parts in scale, size or position. For example, top views of antenna design shown NBDs and electron input/output channels exposing, actual implementations may include other considerations. The figures used for describing the rectenna embodiments in this invention show semiconductor regions disproportionately large and placed in relationship to antennae for explanatory purposes only. Adjustments on the rectenna system may be required to obtain higher packing density or efficiency. According to the present invention, a highly doped n-type material can act as a contact under some situations. Also, a highly doped p-type material can act as a contact under some situations.

A fully depleted region in a device at zero applied bias voltage achieves: (1) When a region is fully depleted at zero applied bias voltage, electrons at the contact/semiconductor junction move from fully depleted p-region to the n-region (positive particle (holes) at the contact/semiconductor junction move from fully depleted n-region to the p-region) as a result of the electric field created by the depletion region. In this case, the distance between the fully depleted p-region and external electrons at the contact/semiconductor junction (the distance between the fully depleted n-region and external positive particles (holes) at the contact/semiconductor junction) is zero. As a result, a reverse bias conducting current is achieved. (2) If a fully depleted p-region has external electrons at the contact/semiconductor junction (a fully depleted n-region has external positive particles (holes) at the contact/semiconductor junction), the reverse bias conductivity occurs without a threshold voltage. (3) The electron at the contact semiconductor junction move against the direction of the electric field created by the depletion region (the external positive particles (holes) at the contact semiconductor junction move in the same direction of the electrical field). For example, an NBD conducts at reverse bias without having a breakdown voltage, as in the case of a conventional diode. (4) An NBD partitions conventional PN junction depletion regions into two electric fields.

The present invention is applicable also to rectenna elements other than dipole rectenna elements. Also, the NBDs of the present invention can be used with practically any antenna types and size to achieve an EM wave to DC power conversion. For an antenna type in which points of maximum voltages or currents may be determined, and for which a gap may be positioned without affecting the operating EM wave frequency response, a gap with an associated NBD may be placed at one or more of such maximum current points. Otherwise, for such an antenna type, a non-gap or gap-less rectenna element may be used by finding maximum voltage points and, at each maximum voltage point along the antenna, place a pair of NBDs to form an input terminal and an output terminal, such as shown in FIGS. 20(*a*) and 20(*b*).

Using the parallel and series connection discussed above for connecting dipole rectennae elements into rectenna arrays, a device can be designed to output any voltage with any antenna type. Further, the rectenna elements on each device may be different, so that a single device may be made to capture various frequencies within a large spectrum of EM waves. Also, different portions of a single device may include rectenna elements of different antenna types and these different portions may be used to perform different functions. The present invention is not limited to a dipole rectenna design, nor to the full wave rectifying rectenna described above. In accordance with the embodiments of the invention, each rectenna element can be of any size, shape or type. In addition, a rectenna array can include more than one type of rectenna elements. For example, in an RFID application, a portion of a rectenna array may be sensitive to one frequency and is used to capture the EM wave to power the RFID circuit, while another portion of the rectenna array may be used for RF transmission and reception. Such an arrangement reduces the required number of parts and creates a more compact design. The single plane construction is not limited to contiguous dipoles but is also applicable to the more usual case of separate dipoles. Although the above configurations mentioned only planar arrays, the present invention is applicable also to non-planar arrays. The invention can also be carried out using discrete parts. Because an NBD of the present invention can rectify very high frequency signals, an EM rectenna of the present invention can be used to detect and rectify very high frequency EM waves efficiently. Thus, detection and power conversion from new frequencies in the EM spectrum can now be achieved where previously were impractical or impossible. This includes generating DC power from the IR and visible light spectra (e.g., solar energy) and fast response photo-sensors for optical sensing and optical networks. The present invention ability to absorb IR frequencies at high efficiencies may be used in such applications as heat shields and cooling devices.

One of the main obstacles preventing the proliferation of solar energy conversion systems is efficiency. The main issue with efficiency is mostly on the rectifiers and the ways that the rectifiers are connected to the antenna. The embodiments presented in the EM rectenna of the present invention improve the efficiency of converting electromagnetic (EM) waves to DC electricity over the prior art by providing the improvements in: (1) full wave rectification for a broader input signal frequency range (e.g., frequencies at or above infra-red), (2) solving the voltage drop problems in rectifiers[3], (3) providing an output voltage level for higher efficiency by utilizing special rectifiers that output a voltage in response to a small signal, (4) full wave rectification with fewer rectifiers, and (5) providing two sources of input currents, one from the received EM wave and the other one from the electron input channels.

[3] A rectifier (typically a diode) in the prior art requires a bias voltage drop across it before it conducts current. A voltage drop creates power loss, especially for low power signals. The voltage drop issue is important in solar engines, since the voltage drop reduces the voltage supplied to the load.

While only dipole antennae are used to illustrate the rectennae of the present invention, the methods discussed above may be used to incorporate other antenna types and sizes into the rectenna of the present invention.

The detailed description above is provided to illustrate the specific embodiments above and is not intended to be limiting. Numerous modifications and variations within the scope of the present invention are possible. The present invention is set forth in the following claims.

We claim:

1. A semiconductor device, comprising:
- a first contact;
- an electronic material;
- a first semiconductor region adjacent to both the first contact and the electronic material having a fully depleted portion extending from the electronic material to the first contact at zero bias and wherein the first contact, the electronic material and the first semiconductor region form a part of a current path.

2. A semiconductor device as in claim 1, wherein the first contact is ohmic, wherein the first semiconductor region is of a first conductivity type and the electronic material comprises a second semiconductor region of a second conductivity type opposite to the first conductivity type adjacent to the first semiconductor region.

3. A semiconductor device as in claim 2, wherein the second semiconductor region is completely depleted at zero bias.

4. A semiconductor device as in claim 1, the electronic material comprises a conductive material forming a schottky barrier to the first semiconductor region.

5. A semiconductor device as in claim 2, wherein the electronic material further comprising a third semiconductor region of the first conductivity type adjacent the second semiconductor region.

6. A semiconductor device as in claim 2, wherein the electronic material further comprising an ohmic contact to the second semiconductor region.

7. A semiconductor device as in claim 1, wherein the first semiconductor region is a forced depleted region.

8. A semiconductor device as in claim 1, wherein the first semiconductor region is a non-forced depleted region.

9. A semiconductor device, comprising:
- a first contact;
- an electronic material; and
- a first semiconductor region adjacent to both the first contact and the electronic material having a first portion of an electric field which is non-zero value extending from the electronic material to the first contact at zero bias and wherein the first contact, the electronic material and the first semiconductor region form a part of a current path.

10. A semiconductor device as in claim 9, wherein the first contact is ohmic, wherein the first semiconductor region is of a first conductivity type and the electronic material comprises a second semiconductor region of a second conductivity type opposite to the first conductivity type adjacent to the first semiconductor region.

11. A semiconductor device as in claim 10, wherein the second semiconductor region is completely depleted at zero bias.

12. A semiconductor device as in claim 9, the electronic material comprises a conductive material forming a schottky barrier to the first semiconductor region.

13. A semiconductor device as in claim 10, wherein the electronic material further comprising a third semiconductor region of the first conductivity type adjacent the second semiconductor region.

14. A semiconductor device as in claim 10, wherein the semiconductor device further comprising an ohmic contact to the second semiconductor region.

15. A semiconductor device as in claim 9, wherein the first semiconductor region is a forced depleted region.

16. A semiconductor device as in claim 9, wherein the first semiconductor region is a non-forced depleted region.

* * * * *